United States Patent
Ohhashi et al.

(10) Patent No.: US 11,362,011 B2
(45) Date of Patent: Jun. 14, 2022

(54) POWER AMPLIFICATION DEVICE

(71) Applicant: NUVOTON TECHNOLOGY CORPORATION JAPAN, Kyoto (JP)

(72) Inventors: Kazuhiko Ohhashi, Osaka (JP); Masatoshi Kamitani, Osaka (JP); Kouki Yamamoto, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/486,313

(22) Filed: Sep. 27, 2021

(65) Prior Publication Data

US 2022/0020658 A1 Jan. 20, 2022

Related U.S. Application Data

(63) Continuation of application No. PCT/JP2020/013167, filed on Mar. 24, 2020.
(Continued)

(51) Int. Cl.
*H03F 3/195* (2006.01)
*H01L 23/367* (2006.01)
(Continued)

(52) U.S. Cl.
CPC .......... *H01L 23/367* (2013.01); *H01L 23/481* (2013.01); *H01L 23/66* (2013.01);
(Continued)

(58) Field of Classification Search
CPC ...................................................... H03F 3/195
(Continued)

(56) References Cited

U.S. PATENT DOCUMENTS 8,890,263 B2 * 11/2014 Yamamura .......... H01L 29/4175
257/194
2002/0171138 A1 11/2002 Osone et al.
(Continued)

FOREIGN PATENT DOCUMENTS

JP 2001-102483 A 4/2001
JP 2002-344147 A 11/2002
(Continued)

OTHER PUBLICATIONS

International Search Report dated Jun. 16, 2020 in International Application No. PCT/JP2020/013167; with English Translation.
(Continued)

*Primary Examiner* — Henry Choe
(74) *Attorney, Agent, or Firm* — McDermott Will & Emery LLP

(57) ABSTRACT

A power amplification device includes: a first semiconductor chip including a first main surface and a second main surface; a first field-effect transistor, a first drain finger part, a plurality of first gate finger parts, and a source finger part; a sub-mount substrate including a third main surface and a fourth main surface; and a first filled via provided penetrating from the third main surface to the fourth main surface. In plan view, the first filled via has a rectangular shape. A long side direction of the first filled via is parallel to a long side direction of the plurality of first gate finger parts. In plan view, the first filled via is positioned to overlap part of one first gate finger part included in the plurality of first gate finger parts.

18 Claims, 17 Drawing Sheets

Related U.S. Application Data

(60) Provisional application No. 62/827,650, filed on Apr. 1, 2019.

(51) Int. Cl.
| | |
|---|---|
| *H01L 23/48* | (2006.01) |
| *H01L 23/66* | (2006.01) |
| *H03F 1/30* | (2006.01) |
| *H03F 3/213* | (2006.01) |

(52) U.S. Cl.
CPC ............ *H03F 1/301* (2013.01); *H03F 3/195* (2013.01); *H03F 3/213* (2013.01); *H01L 2223/6611* (2013.01); *H01L 2223/6622* (2013.01); *H01L 2223/6655* (2013.01); *H03F 2200/447* (2013.01)

(58) Field of Classification Search
USPC .................................................... 330/307, 66
See application file for complete search history.

(56) References Cited

U.S. PATENT DOCUMENTS

| | | |
|---|---|---|
| 2002/0196085 A1 | 12/2002 | Nakamata et al. |
| 2006/0205161 A1 | 9/2006 | Das et al. |
| 2007/0040255 A1 | 2/2007 | Osone et al. |
| 2013/0114212 A1 | 5/2013 | Tada et al. |
| 2013/0228787 A1* | 9/2013 | Yamamura .......... H01L 29/2003 257/195 |
| 2013/0228789 A1* | 9/2013 | Yamamura ............ H01L 29/402 257/195 |
| 2015/0084103 A1 | 3/2015 | Okazaki et al. |
| 2017/0373652 A1 | 12/2017 | Moriya et al. |
| 2018/0331012 A1 | 11/2018 | Shimakawa |

FOREIGN PATENT DOCUMENTS

| | | |
|---|---|---|
| JP | 2003-008470 A | 1/2003 |
| JP | 2005-026368 A | 1/2005 |
| JP | 2006-229218 A | 8/2006 |
| JP | 2007-266539 A | 10/2007 |
| JP | 2013-123031 A | 6/2013 |
| JP | 2014-007323 A | 1/2014 |
| JP | 2015-065233 A | 4/2015 |
| JP | 2017-228966 A | 12/2017 |
| JP | 2018-056318 A | 4/2018 |
| WO | 99/054935 A1 | 10/1999 |
| WO | 2017/094589 A1 | 6/2017 |

OTHER PUBLICATIONS

Written Opinion of the International Searching Authority dated Jun. 16, 2020 in International Application Mo. PCT/JP2020/013167; with English translation.

Chinese Office Action with an English translation of the Search Report dated Jan. 18, 2022, issued for the corresponding Chinese Patent Application No. 202080025389.9.

Notice of Reasons for Refusal dated Mar. 8, 2022 issued in the corresponding Japanese Patent Application No. 2021-511514.

* cited by examiner

POWER AMPLIFICATION DEVICE

CROSS REFERENCE TO RELATED APPLICATIONS

This is a continuation application of PCT International Application No. PCT/JP2020/013167 filed on Mar. 24, 2020, designating the United States of America, which is based on and claims priority of U.S. Provisional Patent Application No. 62/827,650 filed on Apr. 1, 2019. The entire disclosures of the above-identified applications, including the specifications, drawings, and claims are incorporated herein by reference in their entirety.

FIELD

The present disclosure relates to a power amplification device used in a device that transmits high frequency signals.

BACKGROUND

In the field of mobile communication, hybrid mobile communication terminals that integrate a plurality of communication schemes and a plurality of frequency bands are becoming mainstream. With such a hybrid mobile communication terminal, the frequency used differs depending on the communication scheme. Accordingly, to provide support for the frequencies of the respective communication schemes with high frequency circuit blocks, a high frequency circuit block needs to be fabricated for each communication scheme, which consequently increases the size of the hybrid mobile communication terminal. In order to achieve a compact hybrid mobile communication terminal, it is important to reduce the size of the power amplification device which includes peripheral components.

A semiconductor chip and electronic components that make up a matching circuit and the like are mounted on a dielectric substrate in the power amplification device. Module structure that allows the power amplification device to ably dissipate out heat generated by the semiconductor chip is required. In view of this, various techniques have been proposed to improve the heat dissipating ability of the power amplification device.

Patent Literature (PTL) 1 discloses a semiconductor device (a power amplification device) in which, in plan view, a region occupied by a via hole of an emitter electrode or a source electrode of a semiconductor chip and a region occupied by a through-hole of a multi-layer substrate overlap. This configuration improves the heat dissipating ability of the power amplification device by directing heat from heat sources, such as the emitter-base junction, through the via hole of the semiconductor chip and the through-hole of the sub-mount substrate. The heat dissipating ability of the power amplification device is further effectively improved as a result of the heat generating region of the semiconductor chip overlapping a region occupied by one or more through-holes in the sub-mount substrate in plan view.

CITATION LIST

Patent Literature

PTL 1: Japanese Unexamined Patent Application Publication No. 2002-344147

SUMMARY

Technical Problem

However, when a field-effect transistor is used in the power amplification device, the heat source is the gate finger part. Accordingly, favorable results for the most part cannot be expected by dissipating heat from a via hole of the source electrode as disclosed in PTL 1.

Moreover, when the gate finger part, which is the heat source of the semiconductor chip, and one or more through-holes overlap in plan view, the following problems occur.

For example, when a gate finger part is overlapped by one through-hole so as to be contained within the through-hole in plan view, the length of the gate finger part is restricted to a length less than or equal to the diameter of the through-hole. Generally, the larger the diameter of a through-hole is, the harder the through-hole is to make. It is therefore known that increasing the diameter of a through hole is problematic. Accordingly, a number of short gate finger parts are provided in such a case. However, such a configuration is problematic because the length of the semiconductor chip increases in a direction perpendicular to the direction of extension of the gate finger parts, which increases the size of the semiconductor chip.

Furthermore, for example, when a gate finger part and a plurality of through-holes overlap in plan view, gaps are required between the plurality of through-holes, which is problematic because the gaps impair the ability to dissipate heat from the heat source of the semiconductor chip.

In view of this, the present disclosure provides a power amplification device that is more capable of efficiently dissipating heat from a heat source in a semiconductor chip than conventional art.

Solution to Problem

A power amplification device according to one aspect of the present disclosure includes: a first semiconductor chip comprising a compound and including a first main surface and a second main surface opposite the first main surface; a first field-effect transistor provided on the first semiconductor chip; a first drain finger part, a plurality of first gate finger parts, and a source finger part which are provided above the first main surface and included in electrodes of the first field-effect transistor; a source pad electrode provided below the second main surface and electrically connected to the source finger part; a sub-mount substrate comprising a resin and including a third main surface and a fourth main surface opposite the third main surface; a first filled via comprising a metal and provided penetrating from the third main surface to the fourth main surface; a first die pad electrode provided on the third main surface and connected to the first filled via; a first ground electrode provided on the fourth main surface and connected to the first filled via; and a bonding material comprising metal and bonding the second main surface and the first die pad electrode. In plan view, the first filled via has a rectangular shape. A long side direction of the first filled via is parallel to a long side direction of the plurality of first gate finger parts. In plan view, the first filled via is positioned to overlap part of one first gate finger part included in the plurality of first gate finger parts.

A power amplification device according to one aspect of the present disclosure includes: a first semiconductor chip comprising a compound and including a first main surface and a second main surface opposite the first main surface; a first field-effect transistor provided on the first semiconductor chip; a first drain finger part and a plurality of first, gate finger parts which are provided above the first main surface and included in electrodes of the first field-effect transistor; a sub-mount substrate comprising a resin and including a third main surface and a fourth main surface opposite the third main surface; a first filled via comprising a metal and provided penetrating from the third main surface to the fourth main surface; a first die pad electrode provided on the third main surface and connected to the first filled via; and a bonding material comprising metal and bonding the second main surface and the first die pad electrode. In plan view, the first filled via has a rectangular shape. A long side direction of the first filled via is parallel to a first transmission direction which is a transmission direction of a high frequency signal input into the plurality of first gate finger parts and amplified by and output from the first drain finger part.

A power amplification device according to one aspect of the present disclosure includes: a first semiconductor chip comprising a compound and including a first main surface and a second main surface opposite the first main surface; a first field-effect transistor provided on the first semiconductor chip; a first drain finger part, a plurality of first gate finger parts, and a source finger part which are provided above the first main surface and included in electrodes of the first field-effect transistor; a drain wiring part provided above the first main surface and electrically connected to the first drain finger part; a source wiring part provided above the first main surface and electrically connected to the source finger part; a source pad electrode provided below the second main surface and electrically connected to the source finger part; a sub-mount substrate comprising a resin and including a third main surface; a first die pad electrode provided on the third main surface; and a bonding material comprising metal and bonding the second main surface and the first die pad electrode. When a heat generating region of the first semiconductor chip is defined as a region delimited by, in plan view: one first gate finger part included in the plurality of first gate finger parts that is closest to one of edges of the first semiconductor chip that are parallel to a long side direction of the plurality of first gate finger parts; one first gate finger part included in the plurality of first gate finger parts that is closest to an other of the edges of the first semiconductor chip that are parallel to the long side direction; an edge of a distal end of the source finger part which is an end not connected to the source wiring part; and an edge of a distal end of the first drain finger part which is an end not connected to the drain wiring part, a position of a central portion of the heat generating region does not coincide with a position of a central portion of the first semiconductor chip, and the position of the central portion of the heat generating region coincides with a position of a central portion of the first die pad electrode.

Advantageous Effects

The present disclosure can provide a power amplification device that is more capable of efficiently dissipating heat from a heat: source in a semiconductor chip than conventional art.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
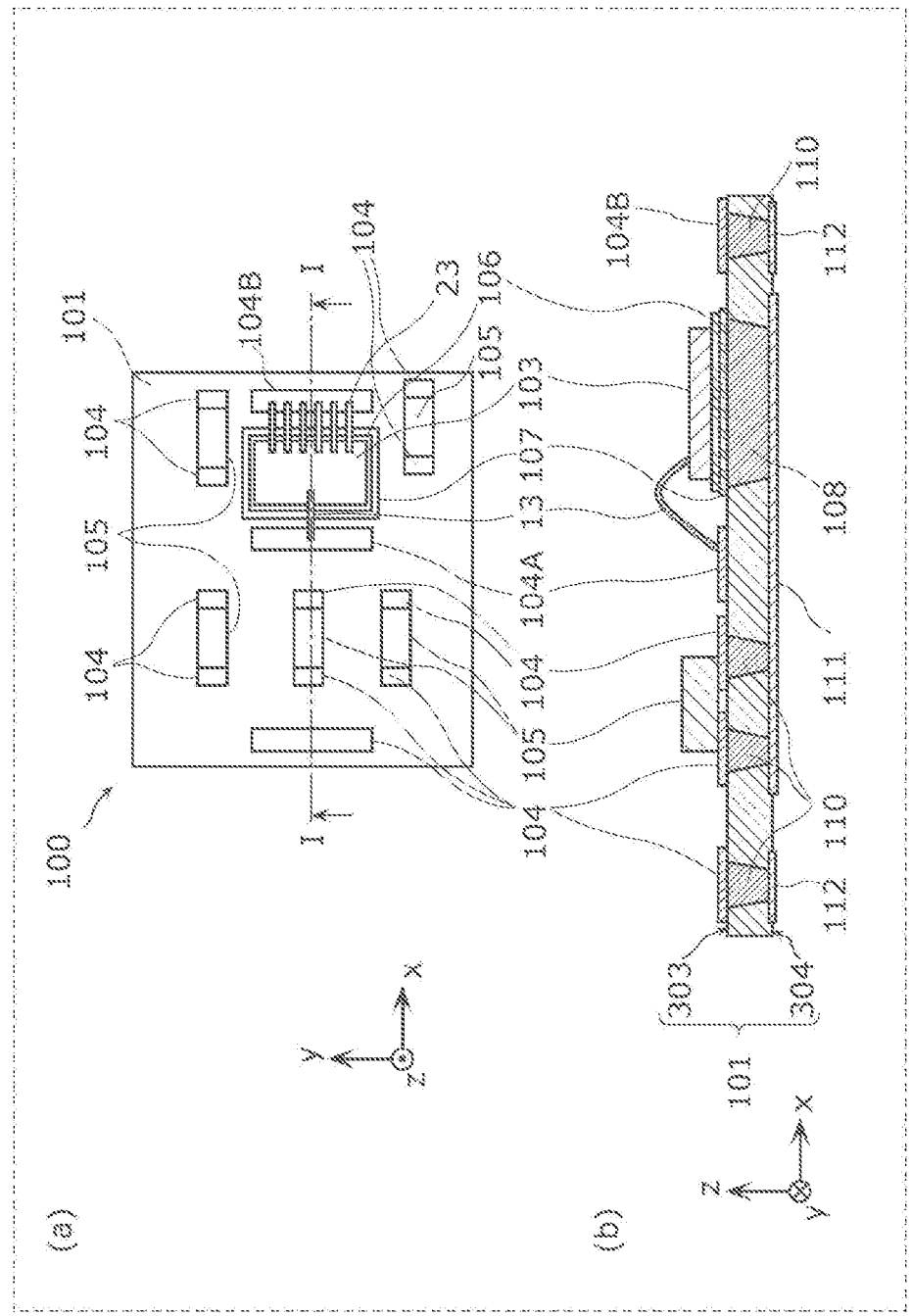
FIG. 1 illustrates a plan view and a cross sectional view of a power amplification device according to Embodiment 1.

Hereinafter, a power amplification device according to embodiments will be described with reference to the drawings. The embodiments described below each show a general or specific example. The numerical values, shapes, materials, elements, the arrangement and connection of the elements, etc., in the following embodiments are mere examples, and therefore are not intended to limit the scope of the present disclosure.

In the following embodiments, the terms "above" and "below" do not refer to the upward (vertically upward) direction and downward (vertically downward) direction in terms of absolute space. Furthermore, the terms "above" and "below" apply not only when two elements are disposed spaced apart and some other element is interposed between the two elements, but also when two elements are disposed in close proximity to each other such that the two elements are in contact with each other.

Note that the respective figures are schematic diagrams and are not necessarily precise illustrations. Accordingly, the figures are not necessarily to scale. Moreover, in the figures, elements that are essentially the same have the same reference signs, and duplicate description is omitted or simplified.

In the present specification, terms indicating relationships between elements such as "parallel" or "orthogonal", terms indicating shapes of elements such as "circular", "square", "rectangular" or "polygonal", and numerical ranges refer not only to their strict meanings, but encompass a range of essentially equivalents, such as a range of deviations of a few percent.

In the present specification and the figures, the x-axis, the y-axis, and the z-axis represent the three axes in a three-dimensional orthogonal coordinate system. In the embodiments, the two axes that are parallel to the third main surface of the sub-mount substrate are the x-axis and the y-axis, and the directions that are orthogonal to the third main surface are referred to as the z-axis directions. In the following embodiments, the z-axis positive direction may be referred to using the term "above", and the z-axis negative direction may be referred to using the term "below".

In the present specification, a "plan view" refers to a view of the sub-mount substrate included in the power amplification device from the z-axis positive direction, and a figure illustrating such a view is also referred to as a "plan view". The phrase "when viewed from the rear" refers to a view of the sub mount substrate included in the power amplification device from the z-axis negative direction, and a figure Illustrating such a view is referred to as a "rear view". In the present specification, a "cross sectional view" refers to a view illustrating only the surface of the cross section.

In the present specification, gallium may be written as "Ga", arsenic may be written as "As", nitrogen may be written as "N" silver may be written as "Ag", gold may be written as "Au", tin may be written as "Sn", copper may be written as "Cu", and tungsten may be written as "W".

Embodiment 1

First, the configuration of power amplification device 100 according to Embodiment 1 will be described with reference to FIG. 1. FIG. 1 illustrates a plan view and a cross sectional view of power amplification device 100 according to Embodiment 1. More specifically, (a) in FIG. 1 illustrates a plan view of power amplification device 100, and (b) in FIG. 1 illustrates a cross sectional view of a cross section taken along line I-I in (a) in FIG. 1.

Power amplification device 100 includes first semiconductor chip 103 on which a first field-effect transistor is provided, sub-mount substrate 101, first filled vias 108, first die pad electrode 107, first ground electrode 111, and a bonding material. In the present embodiment, power amplification device 100 includes gate wire 13, drain wires 23, wiring patterns 104, 104A, and 104B, mounted components 105, fourth filled vias 110, and a plurality of terminal electrodes 112.

First, sub-mount substrate 101, which is a mounting substrate, and elements in the surrounding area thereof will be described.

Sub-mount substrate 101 comprises resin (for example, epoxy resin or the like). Sub-mount substrate 101 includes third main surface 303 and fourth main surface 304 opposite third main surface 303. In the present embodiment, third main surface 303 is the mam surface on the z-axis positive side and fourth main surface 304 is the main surface on the z-axis negative side. First semiconductor chip 103 for amplifying power, and mounted components 105 (for example, a chip component or an integrated passive device (IPD)) such as a capacitor or an inductor for forming a high-frequency matching circuit are mounted on third main surface 303.

First die pad electrode 107 is provided on third main surface 303. First die pad electrode 107 comprises metal (for example, Au, Cu, or Ag or the like). For example, first die pad electrode 107 has, but Is not limited to, a rectangular shape in plan view.

In the present embodiment, the bonding material (hereinafter "first bonding material 106") is provided above first die pad electrode 107. First bonding material 106 comprises metal (for example, Ag paste, sintered Ag, AuSn, or solder or the like). For example, first bonding material 106 has, but is not limited to, a rectangular shape in plan view.

First ground electrode 111 is provided on fourth main surface 304. First ground electrode ill comprises metal (for example, Au, Cu, or Ag or the like).

First die pad electrode 107 and first ground electrode ill are connected by first filled vias 108.

First filled vias 108 are provided penetrating from third main surface 303 to fourth main surface 304 that are included in sub-mount substrate 101. Each first filled via 108 comprises metal (for example, Cu or the like). In the present embodiment, each first filled via 108 functions as an electrode for conducting electricity and as a thermal conducting material that conducts heat generated in first semiconductor chip 103. Although a plurality of first filled vias 108 are provided in the present embodiment, this example is non-limiting; a single first filled via 108 may be provided.

First die pad electrode 107, first bonding material 106, first ground electrode 111, and first filled vias 108, all of which comprise metal, have a higher rate of thermal conductivity than sub-mount substrate 101, which comprises resin.

Fourth filled vias 110 are provided in sub-mount substrate 101. Wiring patterns 104, 104A, and 104B are further provided on third main surface 303. A plurality of terminal electrodes 112 that are electrically connected to circuit nodes (for example, wiring patterns 104 and 104B and the like) provided on sub-mount substrate 101 are provided on fourth main surface 304.

Just like first filled vias 108, fourth filled vias 110 are also provided penetrating from third main surface 303 to fourth main surface 304 that are included in sub-mount substrate 101, and comprise a metal (for example, Cu or the like). Fourth filled vias 110 connect wiring pattern 104 or 104B and first ground electrode 111 or terminal electrode 112.

Wiring patterns 104, 104A, and 104B comprise metal (for example, Au, Cu, or Ag or the like). Wiring patterns 104 connect mounted components 105 and fourth filled vias 110. Wiring pattern 104A is connected to gate wire 13. Wiring pattern 104B connects drain wires 23 and fourth filled via 110.

Gate wire 13 and drain wires 23 are electrically conductive wires. Gate wire 13 and drain wires 23 comprise metal (for example, Cu, Al, or Au or the like).

Next, the configuration of first semiconductor chip 103 included in power amplification device 100 will be described in greater detail with reference to FIG. 2.

Figure 2:
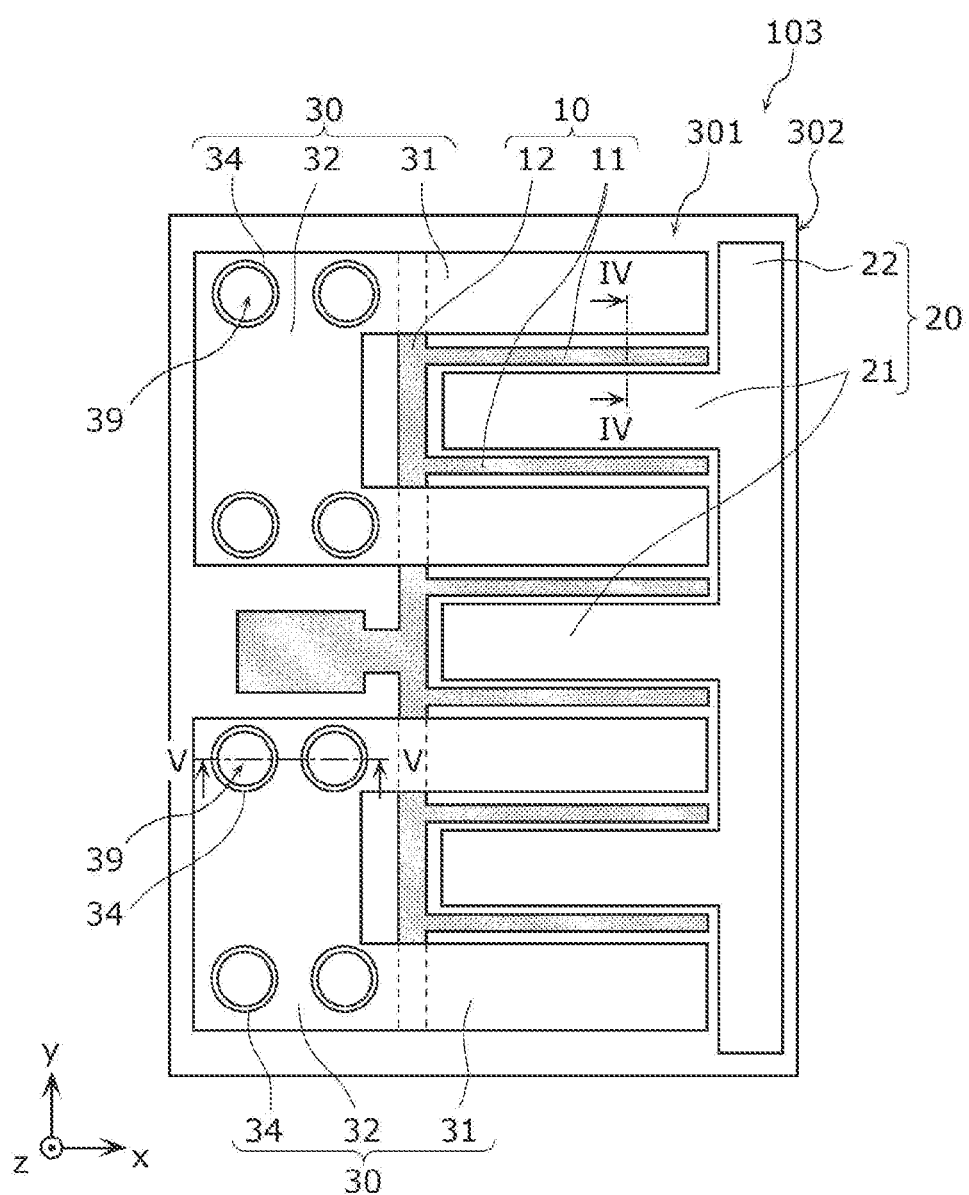
FIG. 2 illustrates a plan view of a first semiconductor chip included in the power amplification device according to Embodiment 1.

FIG. 2 illustrates a plan view of first semiconductor chip 103 included in power amplification device 100 according to Embodiment 1. Note that in FIG. 2, gate electrode 10 is shaded with dots for visual distinction.

As illustrated in FIG. 2, power amplification device 100 includes gate electrode 10, drain electrode 20, and source electrode 30 which are included in electrodes of the first field-effect transistor provided on first semiconductor chip 103.

First semiconductor chip 103 comprises a compound (for example, GaAs or GaN or the like).

First semiconductor chip 103 includes first main surface 301 and second main surface 302 opposite first main surface 301. In the present embodiment, first main surface 301 is the main surface on the z-axis positive side and second main surface 302 is the main surface on the z-axis negative side.

The first field-effect transistor is provided on first semiconductor chip 103. In the present embodiment, a horizontal first field-effect transistor Is provided, and the channel of the first field-effect transistor is provided in the compound that first semiconductor chip 103 comprises.

In the present embodiment, gate electrode 10 includes a plurality of first gate finger parts 11 and gate wiring part 12. The plurality of first gate finger parts 11 are heat sources in first semiconductor chip 103. Drain electrode 20 includes a plurality of first drain finger parts 21 and drain wiring part 22. Source electrode 30 includes a plurality of source finger parts 31, source wiring part 32, and source via hole parts 34.

As illustrated in FIG. 2, gate wiring part 12 is provided above first main surface 301 and is electrically connected to the plurality of first gate finger parts 11. Drain wiring part 22 is provided above first mam surface 301 and is electrically connected to the plurality of first drain finger parts 21. Source wiring part 32 is provided above first main surface 301 and is electrically connected to the plurality of source finger parts 31.

Although a plurality of first drain finger parts 21 and a plurality of source finger parts 31 are provided in the present embodiment, this example is non-limiting; a single first drain finger part 21 and a single source finger part 31 may be provided.

Next, the finger parts and the wiring parts will he described with reference to FIG. 3.

Figure 3:
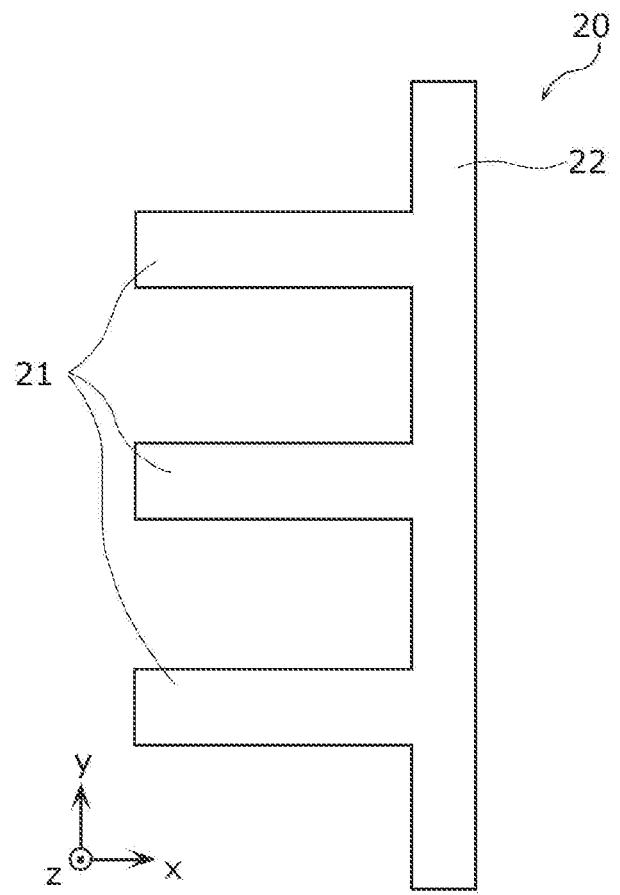
FIG. 3 illustrates a plan view of a drain electrode according to Embodiment 1.

FIG. 3 illustrates a plan view of drain electrode 20 according to Embodiment 1. In the present specification and figures, the regions that protrude from drain wiring part 22 like teeth of a comb are the plurality of first drain finger parts 21, as illustrated in FIG. 3. More specifically, the region extending in a predetermined direction (y-axis direction) is drain wiring part 22, and the regions protruding in a perpendicular direction (x-axis direction) from drain wiring part 22 are the plurality of first drain finger parts 21. The same applies to gate electrode 10 and source electrode 30.

Next, the arrangement of electrodes of the first field-effect transistor will be described with reference to FIG. 4.

Figure 4:
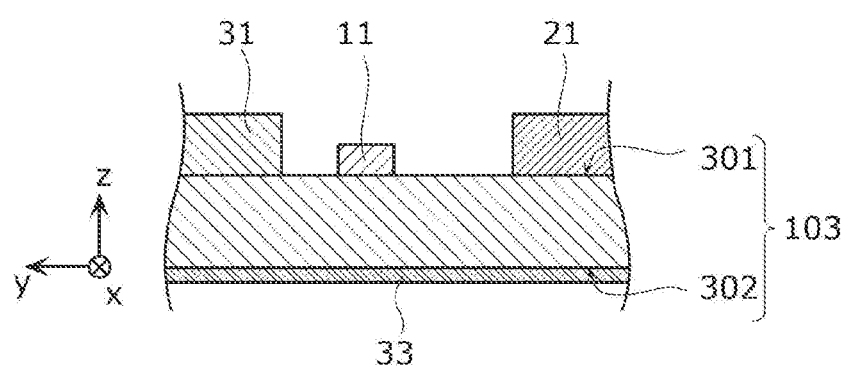
FIG. 4 is a cross sectional view illustrating a cross section of the first semiconductor chip taken along line IV-IV in FIG. 2.

FIG. 4 is a cross sectional view illustrating a cross section of first semiconductor chip 103 taken along line IV-IV in FIG. 2. As illustrated in FIG. 4, first semiconductor chip 103 includes source pad electrode 33. Source pad electrode 33 is provided below second main surface 302.

The plurality of first gate finger parts 11, the plurality of first drain finger parts 21, and the plurality of source finger parts 31 are provided above first main surface 301.

The arrangement of electrodes of the first field-effect transistor will now be described with reference to FIG. 2 once again.

In the present embodiment, the long side direction of the plurality of first gate finger parts 11 is the x-axis direction. The longer the plurality of first gate finger parts 11 are in the long side direction (x-axis direction), the more the resistive component increases and the more the performance (for example, power gain and efficiency) of power amplification device 100 decreases. Accordingly, the length of the plurality of first gate finger parts 11 in the long side direction (x-axis direction) may be 260 µm or less, may preferably be 200 µm or less, and may further preferably be 100 µm or less.

In FIG. 2, gate wiring part 12 is drawn with dashed lines in regions in which the plurality of source finger parts 31 and gate wiring part 12 overlap in plan view. In these regions, a layer having high electrical insulation properties is inserted between the plurality of source finger parts 31 and gate wiring part 12, whereby the plurality of source finger parts 31 and gate wiring part 12 are electrically insulated from one another.

Next, source via hole parts 34, etc., included in source electrode 30 will be described with reference to FIG. 5.

Figure 5:
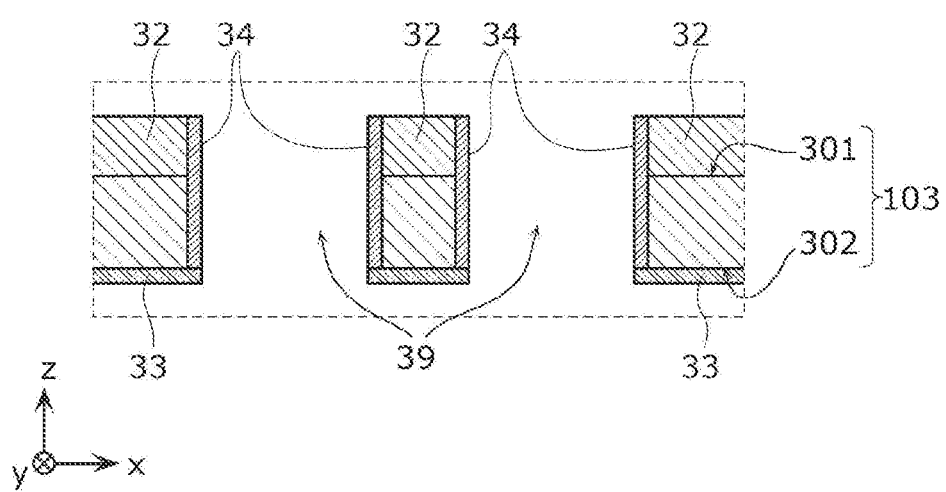
FIG. 5 is a cross sectional view illustrating a cross section of the first semiconductor chip taken along line V-V in FIG. 2.

FIG. 5 is a cross sectional view illustrating a cross section of first semiconductor chip 103 taken along line V-V in FIG. 2.

As illustrated in FIG. 5, first semiconductor chip 103 is provided with via hole parts 39. Each via hole part 39 is a through-hole provided penetrating from first main surface 301 to second main surface 302. Source via hole parts 34 are provided on the inner surfaces of via hole parts 39, and comprise metal (for example, Au, Cu, or Ag or the like). Source via hole parts 34 are formed by, for example, metal plating.

The plurality of source finger parts 31 are electrically connected to source pad electrode 33. In one example, the plurality of source finger parts 31 are electrically connected to source pad electrode 33 via source via hole parts 34.

First bonding material 106 described above bonds second main surface 302 of first semiconductor chip 103 and first die pad electrode 107. In the present embodiment, first bonding material 106 bonds source pad electrode 33 provided on second main surface 302 and first die pad electrode 107.

Next, the positional relationship between first semiconductor chip 103, the plurality of first filled vias 108, and wiring patterns 104A and 104B will be described with reference to FIG. 6.

Figure 6:
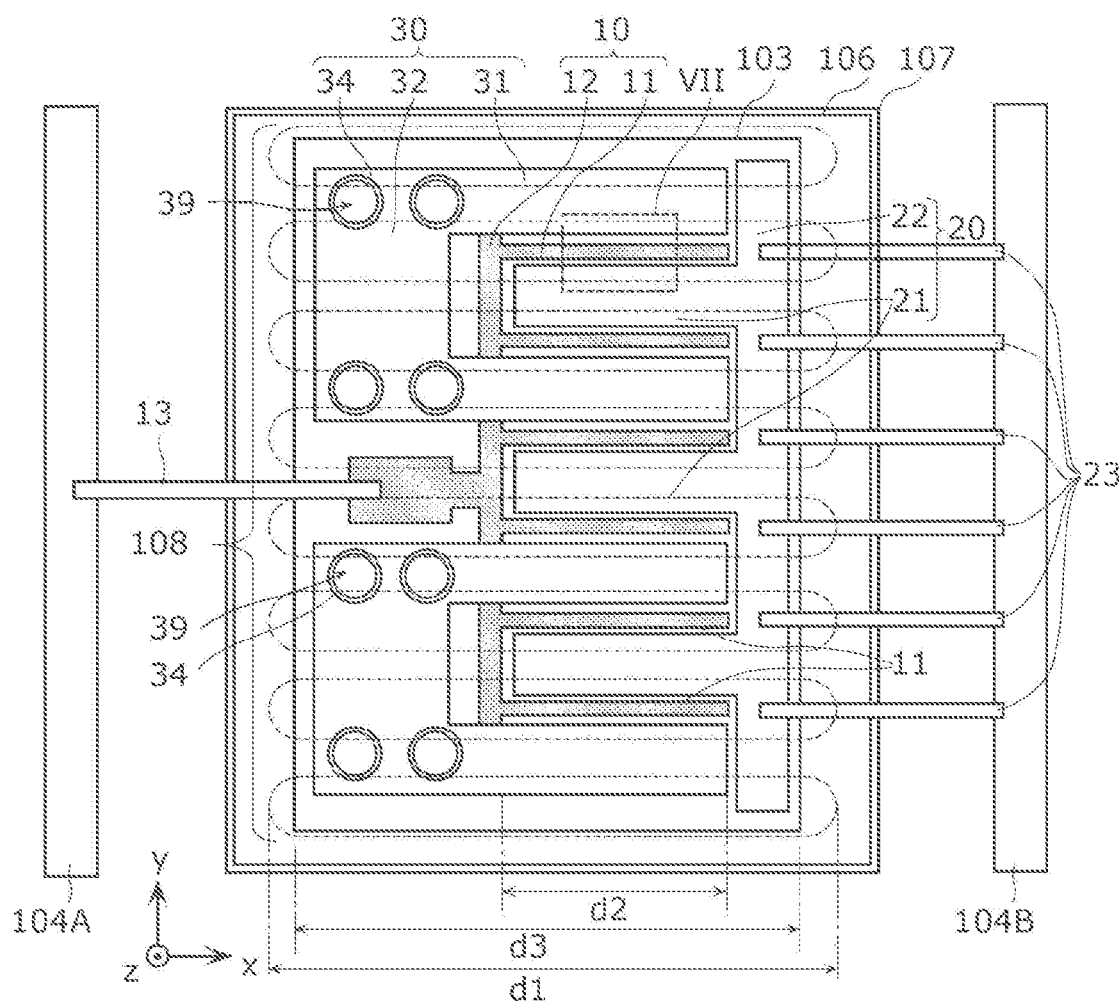
FIG. 6 illustrates a plan view of the first semiconductor chip and a plurality of first filled vias according to Embodiment 1.

FIG. 6 illustrates a plan view of first semiconductor chip 103 and the plurality of first filled vias 108 according to Embodiment 1. The plurality of first filled vias 108 provided in sub-mount substrate 101 are drawn with dashed lines in FIG. 6.

As illustrated in FIG. 6, the plurality of first filled vias 108 have a rectangular shape in plan view. As used herein, a "rectangular" shape may have vertices with right vertex angles or, as illustrated in FIG. 6, may have rounded vertices. In the present embodiment, the plurality of first filled vias 108 are provided so that the long side directions thereof are parallel to one another. In one example, the long side direction of the plurality of rectangular first filled vias 108 is the x-axis direction. The direction perpendicular to the long side direction of the plurality of first filled vias 108 in plan view is referred to as the widthwise direction. In other words, the widthwise direction of the plurality of first filled vias 108 is the y-axis direction. In the present embodiment, the plurality of first filled vias 108 are evenly spaced apart in the y-axis direction.

Next, a typical filled via forming method and the forming method used for first filled vias 108 according to the present embodiment will be described.

First, the typical filled via forming method will be described. With this method, the filled via is formed by opening a hole in the sub-mount substrate with a laser and filling the inside of the hole with plating (for example, Cu or the like). The hole opened by the laser usually has a circular plan view shape. The larger the diameter of the hole is, the easier it is for a recess to form in the central portion of the filled via when the plating such as Cu is filled in the hole, and thus the easier it is for a void to form in the filled via. As a result, on the surface layer of the sub-mount substrate, bondability between the filled via and the bonding wires becomes a problem. Moreover, when mounting a mounted component or a semiconductor chip, bondability between the filled via and the mounted component or the semiconductor chip becomes a problem. In other words, the larger the diameter size of the hole (the diameter size of the filled via) is, the harder it is to bond other elements thereto. Accordingly, with a typical filled via forming method, increasing the diameter size of the filled via is problematic.

With a typical filled via forming method, when the thickness of the sub-mount substrate is approximately 60 µm, the diameter size of the filled via is approximately φ60 µm to φ80 µm. Note that the smaller the thickness of the sub-mount substrate is, the smaller the minimum value of the filled via diameter size can be. When such a filled via is used for dissipating boat from a semiconductor chip, it is necessary to provide more filled vias in contact with die pad electrode.

However, providing more filled vias reduces the amount of space between two adjacent filled vias. In such a case, the shape of the holes deform in the process of removing resinous residue after opening the holes with a laser. In view of this, the desired pitch between the holes (filled vias) is approximately 90 µm.

To summarize the above, with a typical filled via forming method, the number of filled vias that can be provided below a semiconductor chip is limited.

In view of this, in the present embodiment, as one example, the following method is used to form the plurality of first filled vias 108.

Holes that have a rectangular shape in plan view are formed by moving the laser a little in a single direction to continuously open the holes in sub-mount substrate 101, In the present embodiment, the holes are opened while moving the laser in the x-axis direction. Stated differently, the laser is moved so as to be scanned. The plurality of rectangular first filled vias 108 are formed by further filling the insides of the rectangular holes with a plating (for example, Cu or the like). The length of the plurality of first filled vias 108 in the long side direction (x-axis direction) can be, for example, 2000 µm or less. Moreover, the plurality of first filled vias 108 are provided below first die pad electrode 107.

Next, the positional relationship between the plurality of first gate finger parts 11 and the plurality of first filled vias 108 will be described in greater detail.

As described above, both the long side direction of the plurality of first filled vias 108 and the long side direction of the plurality of first gate finger parts 11 are the x-axis direction. Therefore, the plurality of first filled vias 108 are provided such that the long side direction thereof is parallel to the long side direction of the plurality of first gate finger parts 11. As used herein, "parallel" refers to an angle of 5° or less between two directions.

Furthermore, in the present embodiment, in plan view, a plurality of first filled vias 108 (for example, six of the plurality of first filled vias 108 in FIG. 6) are positioned to overlap part of every first gate finger part 11 among the plurality of first gate finger parts 11, respectively. More specifically, a plurality of first filled vias 108 are positioned to overlap the entirety of every first gate finger part 11 among the plurality of first gate finger parts 11, respectively.

Stated differently, each of a plurality of first filled vias 108 is positioned to overlap the entirety of a corresponding one of the plurality of first gate finger parts 11. In other words, in plan view, each first gate finger part 11 is provided such that the entire region thereof is contained within the region of a corresponding first filled via 108. Note that as illustrated in FIG. 6, in the present embodiment, two first filled vias 108 among the plurality of first filled vias 108 are positioned to not overlap any of the plurality of first gate finger parts 11.

Providing overlapping regions in plan view in this way reduces the distance between the plurality of first gate finger parts 11 and the plurality of first filled vias 108. Accordingly, heat generated by the plurality of first gate finger parts 11 is conducted to first ground electrode ill by way of the plurality of first filled vias 108, which comprise metal, and easily dissipated from first ground electrode 111. In other words, power amplification device 100 that is more capable of efficiently dissipating heat from heat sources in first semiconductor chip 103 than conventional art is realized.

Furthermore, power amplification device 100 that is capable of more efficiently dissipating heat when the rate of thermal conductivity of first bonding material 106, first die pad electrode 107, and first ground electrode 111 is higher than the rate of thermal conductivity of sub-mount substrate 101 is realized.

Moreover, the same advantageous effects can be expected even when at least one first filled via 108 among the plurality of first filled vias 108 is positioned to overlap part of one first gate finger part 11 among the plurality of first gate finger parts 11.

Note that, as described above, when a single first filled via 108 is provided, in plan view, the single first filled via 108 may he positioned to overlap part of one first gate finger part 11 from among the plurality of first gate finger parts 11.

This configuration also achieves the same advantageous effects as when a plurality of first filled vias 108 are provided.

Next, the lengths of the plurality of first filled vias 108, the plurality of first gate finger parts 11, and first semiconductor chip 103 will be described.

As described above, the long side direction of the plurality of first filled vias 108 is the x-axis direction. Hereinafter, the long side direction of the plurality of first filled vias 108 may be written as the "x-axis direction". As illustrated in FIG. 6, the length of the long side of the plurality of first filled vias 108, which is defined as the length of the plurality of first filled vias 108 in the x-axis direction, is long-side length d1. The length of the long side of the plurality of first gate finger parts 11, which is defined as the length of the plurality of first gate finger parts 11 in the x-axis direction, is long-side length d2. Furthermore, the length of first semiconductor chip 103 in the x-axis direction is length d3.

Furthermore, in the present embodiment, in plan view, long-side length d1 of the plurality of first filled vias 108 is longer than long-side length d2 of the plurality of first gate finger parts 11.

With this, long-side length d1 of the plurality of first filled vias 108 is a sufficient length for conducting heat. Accordingly, heat generated by the plurality of first gate finger parts 11 is more easily dissipated from first ground electrode 111 by way of the plurality of first filled vias 108. In other words, power amplification device 100 that is capable of even more efficiently dissipating heat from heat sources is realized. Hereinafter, the heat generated by first gate finger parts 11 being more easily dissipated from first ground electrode ill means the realization of power amplification device 100 that is capable of even more efficiently dissipating heat from heat sources.

Note that, as described above, when a single first filled via 108 is provided, in plan view, long-side length d1 of the single first filled via 108 may be longer than long-side length d2 of one first gate finger part 11 from among the plurality of first gate finger parts 11.

This configuration also achieves the same advantageous effects as when a plurality of first filled vias 108 are provided.

Furthermore, in the present embodiment, in plan view, long-side length d1 of the plurality of first filled vias 108 is longer than length d3 of first semiconductor chip 103 in the long side direction (the x-axis direction) of the plurality of first filled vias 108.

With this, long-side length d1 of the plurality of first filled vias 108 is a sufficient length for conducting heat. Heat generated by the plurality of first gate finger parts 11 is more easily dissipated from first ground electrode 111 by way of the plurality of first filled vias 108.

Note that, as described above, when a single first filled via 108 is provided, in plan view, long-side length d1 of the single first filled via 108 may be longer than length d3 of first semiconductor chip 103 in the x-axis direction.

This configuration also achieves the same advantageous effects as when a plurality of first filled vias 108 are provided.

Furthermore, as illustrated in FIG. 6, gate electrode 10 is connected to wiring pattern 104A via gate wire 13. Drain electrode 20 is connected to wiring pattern 104B via drain wires 23.

In the present embodiment, wiring pattern 104A is used as a wiring pattern that receives an input of a high frequency signal, and wiring pattern 104B is used as a wiring pattern that outputs a high frequency signal.

The high frequency signal is input into the plurality of first gate finger parts 11 and amplified by and output from the plurality of first drain finger parts 21. This will now be described in greater detail. The high frequency signal is input from wiring pattern 104A into gate wiring part 12 via gate wire 13. The input high frequency signal is split by the plurality of first gate finger parts 11. The split high frequency signal is amplified while in the plurality of first drain finger parts 21 and then combined at drain wiring part 22. The combined high frequency signal is output to wiring pattern 104B via drain wires 23.

Here, when the transmission direction of the high frequency signal is referred to as a first transmission direction, the first transmission direction is the direction of extension of the plurality of first gate finger parts 11 (the x-axis direction). Moreover, in the present embodiment, the plurality of first filled vias 108 are provided such that the long side direction thereof is parallel to the first transmission direction. Specifically, both the long side direction of the plurality of first filled vias 108 and the first transmission direction (the direction of extension of the plurality of first gate finger parts 11) are the x-axis direction.

With this, heat generated by the plurality of first gate finger parts 11 is more easily dissipated from first ground electrode 111 by way of the plurality of first filled vias 108.

Note that as described above, when a single first filled via 108 is provided, the single first filled via 108 is provided such the long side direction thereof is parallel to the first transmission direction.

This configuration also achieves the same advantageous effects as when a plurality of first filled vias 108 are provided.

Next, the positional relationship between the plurality of first gate finger parts 11 and the plurality of first filled vias 108 will be further described with reference to FIG. 7.

Figure 7:
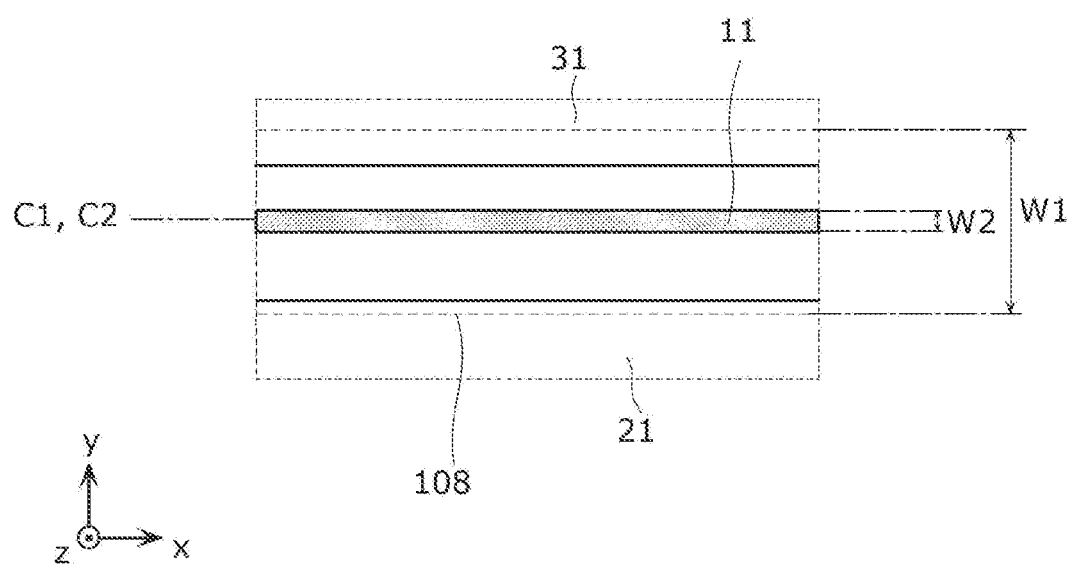
FIG. 7 is an enlarged plan view of region VII of the first semiconductor chip illustrated in FIG. 6.

FIG. 7 is an enlarged plan view of region VII of first semiconductor chip 103 illustrated in FIG. 6. Region VII is the region surrounded by the rectangular dashed line in FIG. 6.

Next, the width of the plurality of first filled vias 108 and the width of the plurality of first gate finger parts 11 will be described. As described above, the widthwise direction of the plurality of first filled vias 108 is the y-axis direction. Accordingly, the width of the plurality of first filled vias 108, which is the length of the plurality of first filled vias 108 in the y-axis direction, is width W1, and the width of the plurality of first gate finger parts 11, which is the length of the plurality of first gate finger parts 11 in the y-axis direction, is width W2.

Moreover, the central position of the width of the plurality of first filled vias 108 and the central position of the width of the plurality of first gate finger parts 11 are a central position of the length in the widthwise direction (y-axis direction). Accordingly, the central position of the width of the plurality of first filled vias 108 is central position C1, and the central position of the width of the plurality of first gate finger parts 11 is central position C2.

Furthermore, in the present embodiment, in plan view, central position C1 of the plurality of first filled vias 108 coincides with central position C2 of the plurality of first gate finger parts 11. As used herein, "coincides" means the two positions being compared are positioned 50 μm or less from each other in plan view.

With this, the distance between the plurality of first gate finger parts 11 and the plurality of first filled vias 108 becomes sufficiently close. Heat generated by the plurality of first gate finger parts 11 is more easily dissipated from first ground electrode 111 by way of the plurality of first filled vias 108.

Note that, as described above, when a single first filled via 108 is provided, in plan view, central position C1 of the width of the single first filled via 108 may coincide with central position C2 of the width of one first gate finger part 11 from among the plurality of first gate finger parts 11.

This configuration also achieves the same advantageous effects as when a plurality of first filled vias 108 are provided.

Furthermore, in the present embodiment, in plan view, width W1 of the plurality of first filled vias 108 is wider than width W2 of the plurality of first gate finger parts 11.

With this, width W1 of the plurality of first filled vias 108 is a sufficient width for conducting heat. Heat generated by the plurality of first gate finger parts 11 is more easily dissipated from first ground electrode 111 by way of the plurality of first filled vias 108.

Note that, as described above, when a single first filled via 108 is provided, in plan view, width W1 of the single first filled via 108 may be wider than width W2 of one first gate finger part 11 from among the plurality of first gate finger parts 11.

This configuration also achieves the same advantageous effects as when a plurality of first filled vias 108 are provided.

Embodiment 2

In Embodiment 1, the sub-mount substrate is a single-layer substrate, but this example is non-limiting. In Embodiment 2, the sub-mount substrate is a multi-layer substrate. Note that in Embodiment 2, elements that are the same as in Embodiment 1 share the same reference signs, and repeated description thereof is omitted.

Figure 8:
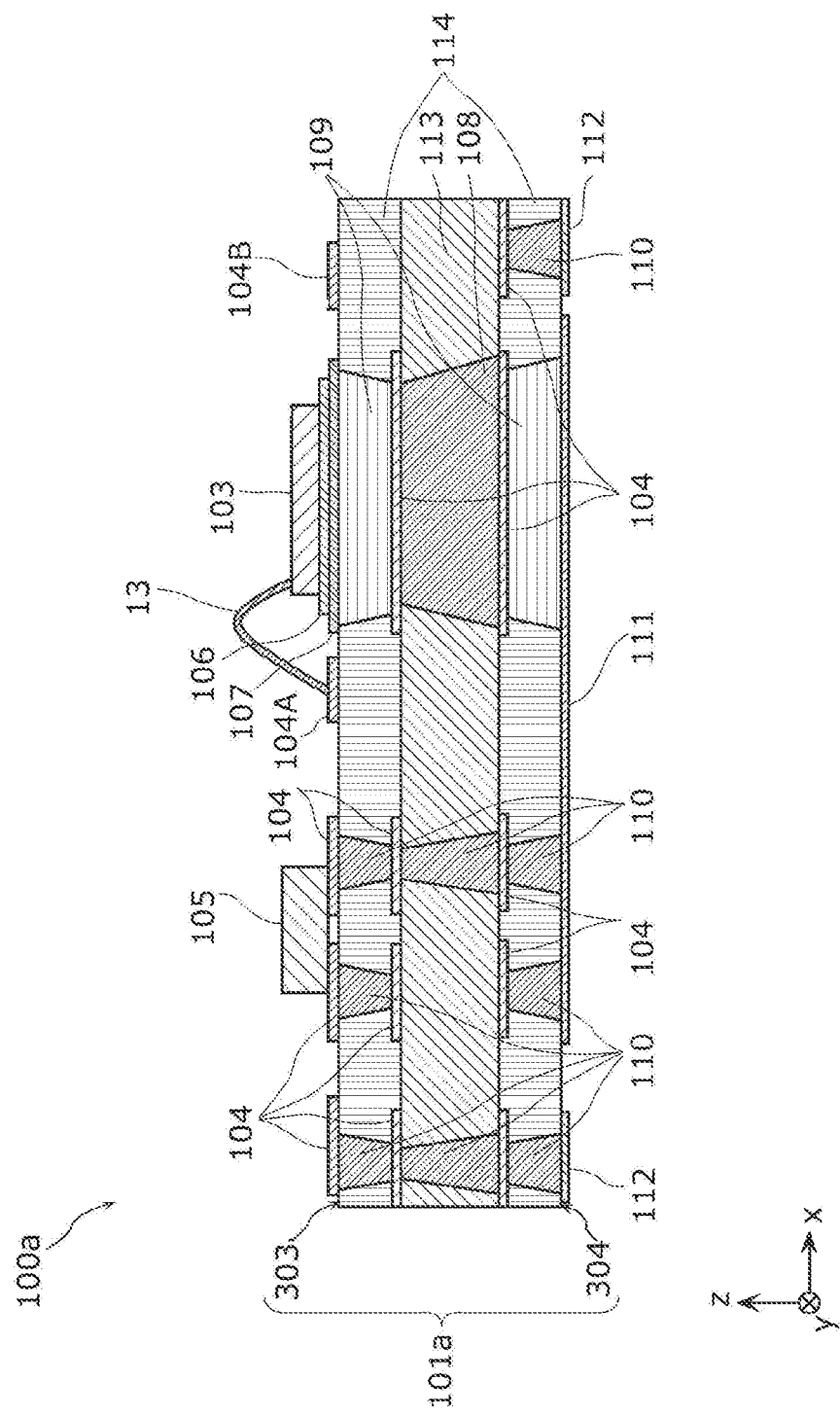
FIG. 8 illustrates a cross sectional view of a power amplification device according to Embodiment 2.

First, the configuration of power amplification device 100a according to Embodiment 2 will be described with reference to FIG. 8. FIG. 8 illustrates a cross sectional view of power amplification device 100a according to Embodiment 2. More specifically, FIG. 8 corresponds to the cross sectional view of power amplification device 100 according to Embodiment 1 illustrated in (b) in FIG. 1.

Excluding mainly the three following points, power amplification device 100a according to the present embodiment has the same configuration as power amplification device 100 according to Embodiment 1. The three points are, specifically, that: sub-mount substrate 101a includes core layer 113 and two prepreg layers 114; core layer 113 is provided with first filled via 108; and each of the two prepreg layers 114 is provided with third filled via 109.

Sub-mount substrate 101a according to Embodiment 2 is a multi-layer substrate. Sub-mount substrate 101a includes core layer 113 and two prepreg layers 114. Core layer 113 is sandwiched between the two prepreg layers 114. This makes sub-mount substrate 101a a multi-layer substrate. Just like sub-mount substrate 101 according to Embodiment 1, core layer 113 and the two prepreg layers 114 comprise resin.

Power amplification device 100a according to the present embodiment is provided with first filled via 108 and a plurality of third filled vias 109. First filled via 108 is provided in core layer 113, and the plurality of third filled vias 109 are respectively provided in the prepreg layers 114.

Just like first filled via 108, the plurality of third filled vias 109 comprise metal (for example, Cu or the like) and have a rectangular shape in plan view.

Each of the plurality of third filled vias 109 is provided so as to electrically contact first filled via 108 (via-on-via). As illustrated in FIG. 8, first filled via 108 is in contact with each of the plurality of third filled vias 109 via wiring patterns 104. With this, first die pad electrode 107 provided on third mam surface 303 and first ground electrode 111 provided on fourth main surface 304 are connected together.

In other words, even when sub-mount substrate 101a is a multi-layer substrate, heat generated by heat sources is easily dissipated from first ground electrode ill by way of first filled via 108 and the plurality of third filled vias 109. In other words, power amplification device 100a that is capable of even more efficiently dissipating heat from heat sources is realized.

In the present embodiment, sub-mount substrate 101a is a multi-layer substrate including three layers, but this example is non-limiting. For example, sub-mount substrate 101a may be a multi-layer substrate including a plurality of layers (for example, five layers).

Embodiment 3

In Embodiment 1, in plan view, for example, the entire region of one first gate finger part is provided to be contained within the region of one first filled via, but this example is non-limiting. In Embodiment 3, the entire regions of two respective first gate finger parts are provided to be contained within the region of one first filled via. Note that in Embodiment 3, elements that are the same as in Embodiments 1 and 2 share the same reference signs, and repeated description thereof is omitted.

Figure 9:
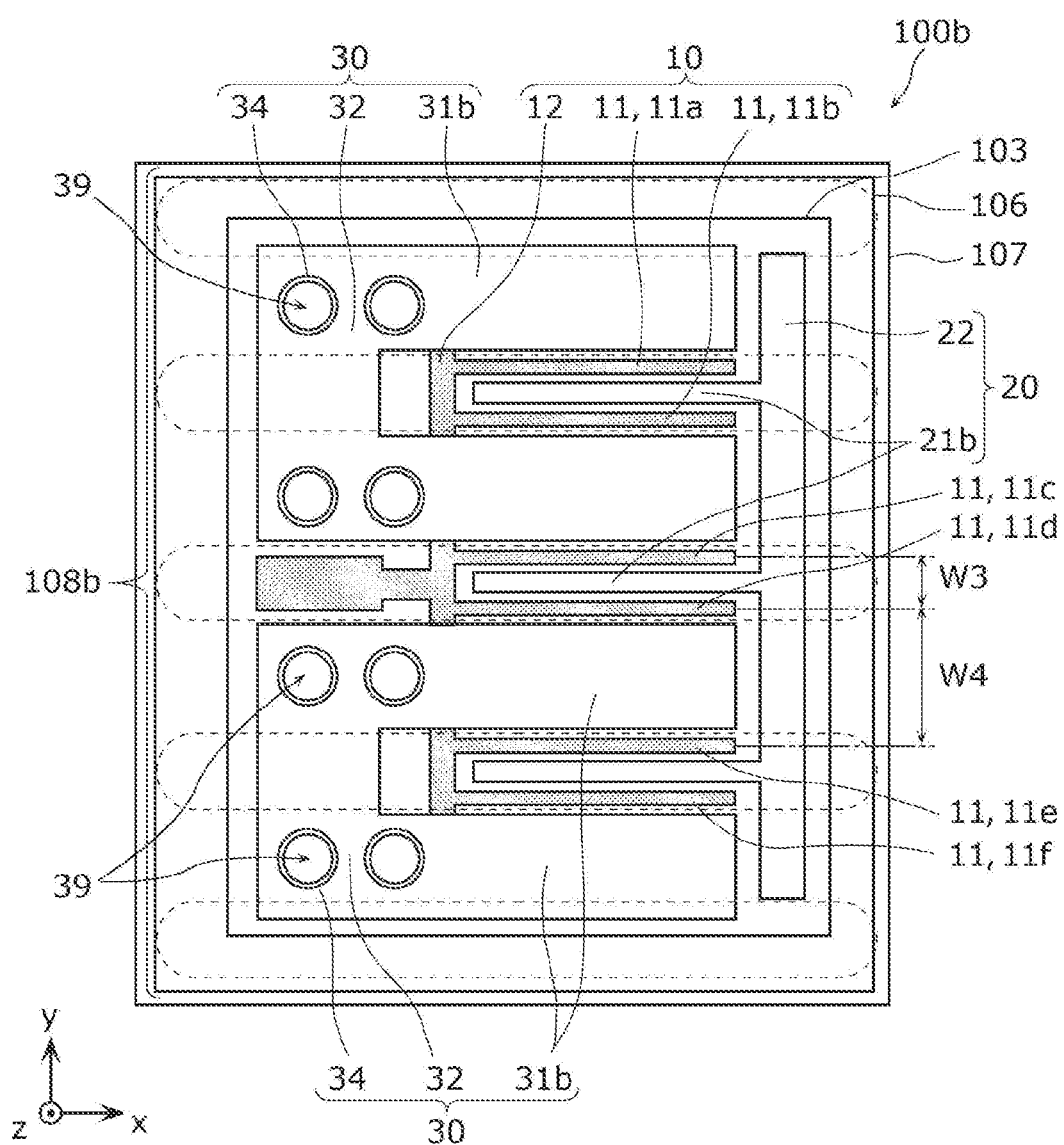
FIG. 9 illustrates a plan view of a first semiconductor chip and a plurality of first filled vias according to Embodiment 3.

First, the configuration of power amplification device 100b according to Embodiment 3 will be described with reference to FIG. 9. FIG. 9 illustrates a plan view of first semiconductor chip 103 and the plurality of first filled vias 108b according to Embodiment 3. More specifically, FIG. 9 corresponds to FIG. 6 according to Embodiment 1. The plurality of first filled vias 108b provided in sub-mount substrate 101 are drawn with dashed lines in FIG. 9.

Excluding mainly the two following points, power amplification device 100b according to the present embodiment has the same configuration as power amplification device 100 according to Embodiment 1. The two points are, specifically, that: a first filled via 108b and the entirety of each of two nearest-neighbor first gate finger parts 11 overlap; and the pitch between each of the plurality of first gate finger parts 11 is a predetermined distance.

Power amplification device 100b according to the present embodiment includes a plurality of first gate finger parts 11. Here, for distinction, the plurality of first gate finger parts 11 are respectively referred to as first gate finger parts 11a, 11b, 11c, 11d, 11e, and 11f, as illustrated in FIG. 9.

Next, two nearest-neighbor first gate finger parts 11 among the plurality of first gate finger parts 11 will be described.

For example, two nearest-neighbor first gate finger parts 11 are first gate finger parts 11a and 11b. Similarly, two nearest-neighbor first gate finger parts 11 are first gate finger parts 11c and 11d or first gate finger parts 11e and 11f. Note that hereinafter, two nearest-neighbor first gate finger parts 11 may be referred to simply as a "first gate finger pair". In other words, in the present embodiment, a plurality of (three) first gate finger pairs are provided.

In the present embodiment, in plan view, each of a plurality of first filled vias 108b (for example, three of the plurality of first filled vias 108b in FIG. 9) is positioned to overlap part of each of the two first gate finger parts 11 in a corresponding first gate finger pair. More specifically, in plan view, each of a plurality of first filled vias 108b is positioned to overlap the entirety of each of the two first gate finger parts 11 in a corresponding first gate finger pair. Stated differently, each of a plurality of first filled vias 108b is positioned to overlap the entirety of a corresponding one of the plurality of first gate finger pairs. Note that as illustrated in FIG. 9, in the present embodiment, two first filled vias 108b among the plurality of first filled vias 108b are positioned to not overlap any of the plurality of first gate finger pairs.

For example, in the present embodiment, one first filled via 108b is positioned to overlap the entirety of each of first gate finger parts 11a and 11b. Stated differently, in plan view, the entire regions of respective first gate finger parts 11a and 11b are provided to be contained within the region of one first filled via 108b. Moreover, as described above, one first filled via 108b may be positioned to overlap part of each of first gate finger parts 11a and 11b. Note that the same applies to other first filled vias 108b, first gate finger parts 11c and 11d, and first gate finger parts 11e and 11f.

With this, heat generated by two nearest-neighbor first gate finger parts 11 can be dissipated from first ground electrode 111 by way of one first filled via 108b. Accordingly, since it is easy to more efficiently dissipate heat from heat sources even when a plurality of first gate finger parts 11 are provided closer together, it is possible to reduce the size of first semiconductor chip 103. Thus, it is possible to reduce the size of power amplification device 100b.

Note that in the present embodiment as well, a single first filled via 108b may be provided, just like in Embodiment 1. In other words, in plan view, a single first filled via 108b is positioned to overlap part of each of two nearest-neighbor first gate finger parts 11 included in the plurality of first gate finger parts 11.

In this case as well, heat generated by two nearest-neighbor first gate finger parts 11 can be dissipated from first ground electrode 111 by way of one first filled via 108b. Accordingly, even when a single first filled via 108b is provided, power amplification device 100b that is capable of even more efficiently dissipating heat from heat sources is realized.

Next, the plurality of nearest-neighbor first gate finger parts 11 interposed by first drain finger part 21b and the plurality of nearest-neighbor first gate finger parts 11 interposed by source finger part 31b will be described.

For example, the plurality of nearest-neighbor first gate finger parts 11 interposed by first drain finger part 21b are first gate finger parts 11c and 11d. In this case, in plan view, the pitch between first gate finger parts 11c and 11d is pitch W3.

For example, the plurality of nearest-neighbor first gate finger parts 11 interposed by source finger part 31b are first gate finger parts 11d and 11e. In this case, in plan view, the pitch between first gate finger parts 11d and 11e is pitch W4.

As used herein, "pitch" refers to the distance between the central positions in the widthwise direction (y-axis direction) of the plurality of first gate finger parts 11 being measured.

Furthermore, in the present embodiment, pitch W3 is narrower than pitch W4.

For example, in plan view, the length in the widthwise direction (y-axis direction) of source finger part 31b may be greater than or equal to 100 μm and less than or equal to 300 μm, and the length in the widthwise direction (y-axis direction) of first drain finger part 21 may be greater than or equal to 5 μm and less than or equal to 40 μm. With this, a configuration in which pitch W3 is narrower than pitch W4 can be easily realized.

Such a configuration makes it possible to lower the capacitance between gate electrode 10 and drain electrode 20 and increase the performance of the first field-effect transistor provided on first semiconductor chip 103.

Embodiment 4

In Embodiment 1, a single semiconductor chip is provided, but this example is non-limiting. In Embodiment 4, for example, a plurality of semiconductor chips are provided. Note that in Embodiment 4, elements that are the same as in Embodiments 1 through 3 share the same reference signs, and repeated description thereof is omitted.

Figure 10:
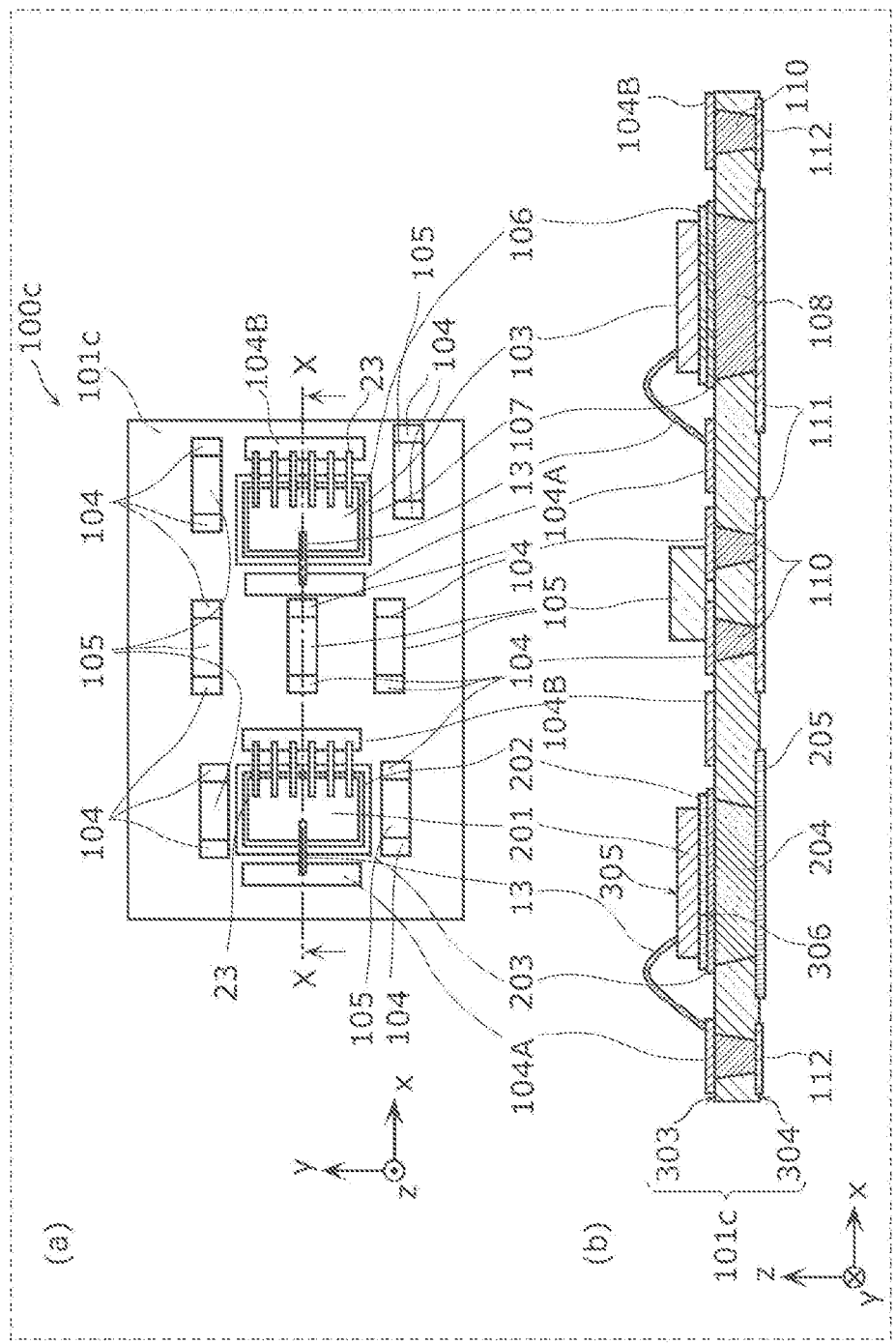
FIG. 10 illustrates a plan view and a cross sectional view of a power amplification device according to Embodiment 4.

First, the configuration of power amplification device 100c according to Embodiment 4 will be described with reference to FIG. 10. FIG. 10 illustrates a plan view and a cross sectional view of power amplification device 100c according to Embodiment 4. More specifically, (a) in FIG. 10 illustrates a plan view of power amplification device 100c, and (b) in FIG. 10 illustrates a cross sectional view of a cross section taken along line X-X in (a) in FIG. 10.

Excluding the inclusion of elements related to second semiconductor chip 201, power amplification device 100c according to the present embodiment has mainly the same configuration as power amplification device 100 according to Embodiment 1.

Power amplification device 100c includes: the elements included in power amplification device 100 according to Embodiment 1; second semiconductor chip 201; second filled vias 204; and second ground electrode 205. In the present embodiment, power amplification device 100c includes: second bonding material 202; second die pad electrode 203; a second field-effect transistor; a gate electrode, a drain electrode, and a source electrode which are included in electrodes of the second field-effect transistor; gate wire 13; drain wires 23; and wiring patterns 104A and 104B.

Second semiconductor chip 201 is a semiconductor chip that includes fifth main surface 305 and sixth main surface 306 opposite fifth main surface 305. In the present embodiment, fifth main surface 305 is the main surface on the z-axis positive side and sixth main surface 306 is the main surface on the z-axis negative side.

Note that second semiconductor chip 201 includes the same elements as first semiconductor chip 103, and the connection relationships with other elements are also the same. For example, fifth mam surface 305 is a main surface corresponding to first main surface 301 of first semiconductor chip 103, and sixth main surface 306 is a main surface corresponding to second main surface 302 of first semiconductor chip 103.

Furthermore, second semiconductor chip 201 comprises a compound (for example, GaAs or GaN or the like). Note that second semiconductor chip 201 and first semiconductor chip 103 may comprise the same compound, and, alternatively, may comprise different compounds. in the present embodiment, second semiconductor chip 201 has the same plan view shape as first semiconductor chip 103 according to Embodiment 1.

The second field-effect transistor corresponds to the first field-effect transistor, and is provided on second semiconductor chip 201. In the present embodiment, a horizontal second field-effect transistor is provided. The channel of the second field-effect transistor is provided in the compound that second semiconductor chip 201 comprises.

The gate electrode included in the electrodes of the second field-effect transistor is connected to wiring pattern 104A via gate wire 13. The gate electrode includes a plurality of second gate finger parts and a gate wiring part.

The drain electrode included in the electrodes of the second field-effect transistor is connected to wiring pattern 104B via dram wires 23. The drain electrode includes a plurality of second drain finger parts and a drain wiring part. Although the drain electrode includes a plurality of second drain finger parts, this example is non-limiting; the drain electrode may include a single second drain finger part.

The source electrode included in the electrodes of the second field-effect transistor is connected to second bonding material 202. The source electrode includes a plurality of source finger parts, a source wiring part, and source via hole parts.

Second bonding material 202 corresponds to first bonding material 106, and second die pad electrode 203 corresponds to first die pad electrode 107. Second die pad electrode 203 is provided on third main surface 303 and connected to second filled vias 204.

Second filled vias 204 correspond to first filled vias 108 and are provided penetrating from third main surface 303 to fourth main surface 304 that are included in sub-mount substrate 101c. Each second filled via 204 comprises metal (for example, Cu or the like). Each second filled via 204 is connected to sixth main surface 306 of second semiconductor chip 201. In the present embodiment, each second filled via 204 is bonded to sixth main surface 306 via second bonding material 202 and second die pad electrode 203 described above. Although a plurality of second filled vias 204 are provided in the present embodiment, this example is non-limiting; a single second filled via 204 may be provided.

In the present embodiment, in plan view, the plurality of second filled vias 204 have the same shape and are arranged the same as the plurality of first filled vias 108 according to Embodiment 1. In other words, the plurality of second filled vias 204 have a rectangular shape in plan view, and the plurality of second filled vias 204 are provided so that the long side directions thereof are parallel to one another.

The long side direction of the plurality of second filled vias 204 is the x axis direction. Accordingly, in the present embodiment, the long side direction of the plurality of first filled vias 108 and the long side direction of the plurality of second filled vias 204 are parallel.

Second ground electrode 205 corresponds to first ground electrode 111 and is provided on fourth main surface 304. Second ground electrode 205 comprises metal (for example, Au, Cu, or Ag or the like). Second ground electrode 205 is connected to second filled vias 204. Second ground electrode 205 is provided spaced apart from first ground electrode 111.

In this way, by spacing first ground electrode ill and second ground electrode 205 apart from one another, it is possible to inhibit adverse effects caused by interference between first semiconductor chip 103 and second semiconductor chip 201 due to heat generated by one affecting the other.

When, like in the present embodiment, a plurality of semiconductor chips (in other words, first semiconductor chip 103 and second semiconductor chip 201) are provided and each of the plurality of semiconductor chips is provided with a ground electrode (in other words, first ground electrode 111 and second ground electrode 205), the ground electrodes connected to the respective semiconductor chips may be formed spaced apart from one another. As a result, in the present embodiment, adverse effects caused by interference between first semiconductor chip 103 and second semiconductor chip 201 due to heat generated by one affecting the other is inhibited, whereby first semiconductor chip 103 and second semiconductor chip 201 can stably operate.

Moreover, in the present embodiment, first ground electrode 111 and second ground electrode 205 are provided spaced apart from one another such that a space is provided therebetween. Accordingly, for example, even if first ground electrode ill and second ground electrode 205 expand in volume due to heat or the like, since the space provides room for the expansion, it is possible to reduce warping of power amplification device 100c.

Embodiment 5

In Embodiments 1 through 4, a single first ground electrode is provided, but this example is non-limiting. In Embodiment 5, a plurality of first ground electrodes are provided. Note that in Embodiment 5, elements that are the same as in Embodiments 1 through 4 share the same reference signs, and repeated description thereof is omitted.

Figure 11:
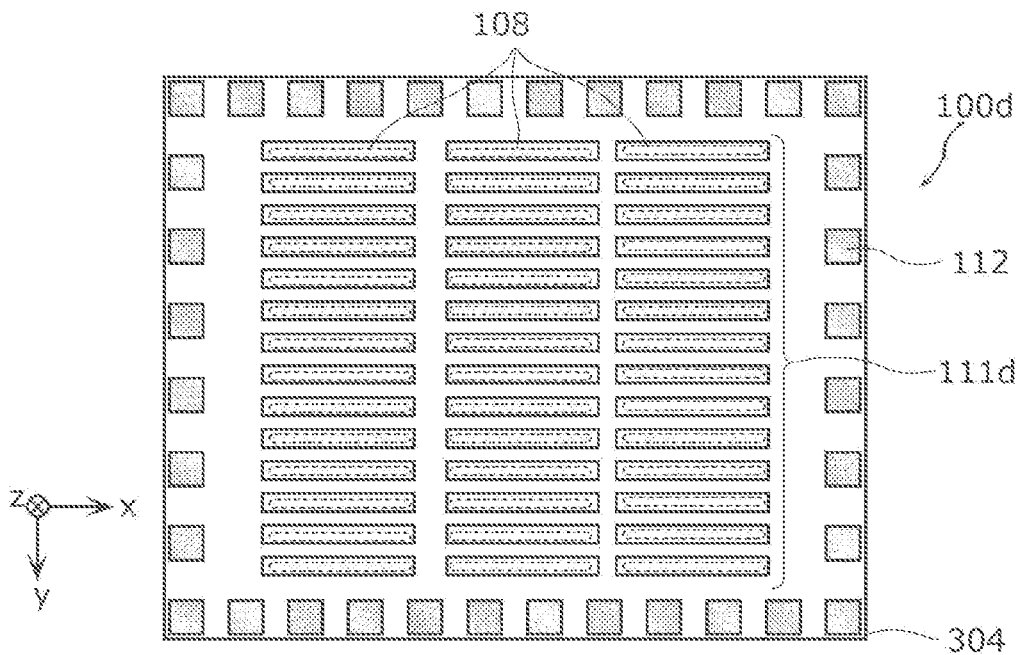
FIG. 11 illustrates a rear view of a power amplification device according to Embodiment 5.

First, the configuration of power amplification device 100d according to Embodiment 5 will be described with reference to FIG. 11. FIG. 11 illustrates a rear view of power amplification device 100d according to Embodiment 5. Note that in FIG. 11, the plurality of terminal electrodes 112 are shaded with dots and the plurality of first filled vias 108 are drawn with dashed lines for visual distinction.

Excluding mainly the two following points, power amplification device 100d according to the present embodiment has the same configuration as power amplification device 100 according to Embodiment 1. The two points are, specifically, that: a plurality of first ground electrodes 111d are provided; and the plurality of first ground electrodes 111d are respectively connected to the plurality of first filled vias 108.

Power amplification device 100d includes the elements included in power amplification device 100 according to Embodiment 1 and a plurality of first ground electrodes 111d provided spaced apart from one another. As illustrated in FIG. 11, in plan view, the plurality of first ground electrodes 111d have a rectangular shape and are arranged in a matrix.

Just like in the above embodiments, the plurality of terminal electrodes 112 are provided on fourth main surface 304 in the present embodiment as well. Each of the plurality of terminal electrodes 112 is disposed in the periphery of fourth main surface 304 so as to surround the plurality of first ground electrodes 111d. The plurality of terminal electrodes 112 are provided spaced apart from one another.

The plurality of first ground electrodes 111d are respectively connected to the plurality of first filled vias 108. In plan view, the plurality of first filled vias 108 are respectively contained within the plurality of first ground electrodes 111d. Note that one or more first filled vias 108 not contained within a first ground electrode 111d may be provided.

Next, the plurality of first filled vias 108 will be described. For example, as described in Embodiment 1, in plan view, the plurality of first filled vias 108 are positioned to respectively partially overlap the plurality of first gate finger parts. More specifically, in plan view, the plurality of first filled vias 108 are positioned to respectively entirely overlap the plurality of first gate finger parts. For example, in plan view, each first gate finger part is provided such that the entire region thereof is contained within the region of a corresponding first filled via 108.

In the present embodiment, since heat, generated by the plurality of first gate finger parts is dissipated from each of the plurality of first ground electrodes 111d, the heat is more easily dissipated.

Moreover, by spacing the plurality of first ground electrodes 111d apart, a space is provided between each of the plurality of first ground electrodes 111d. Accordingly, as described above, it is possible to reduce warping of power amplification device 100d.

Although all of the plurality of first ground electrodes 111d have the same shape in the present embodiment, this example is non-limiting. For example, a first ground electrode 111d not connected to a first filled via 108 need not have the same shape as other first ground electrodes 111d.

Moreover, the present embodiment is not limited to the above. Next, a variation of the present embodiment will be given.

As a variation, the present embodiment may have the configuration described in Embodiment 3, for example. In Embodiment 3, in plan view, each of a plurality of first filled vias 108b is positioned to overlap part of each of the two first gate finger parts 11 in a corresponding first gate finger pair. More specifically, in plan view, each of a plurality of first filled vias 108b is positioned to overlap the entirety of each of the two first gate finger parts 11 in a corresponding first gate finger pair. This relationship between a plurality of first filled vias 108 and the first gate finger pairs is the same in this variation of the present embodiment.

For example, in this variation of the present embodiment, one first filled via 108 may be positioned to overlap the entirety of each of two first gate finger parts (for example, first gate finger parts 11a and 11b described in Embodiment 3). Stated differently, in plan view, the two first gate finger parts may be provided to be contained within one first filled via 108.

Note that the same applies to other first filled vias 108. Moreover, a first filled via 108 that does not overlap with a first gate finger pair may be provided.

This variation of the present embodiment achieves the same advantageous effects as the present embodiment.

Furthermore, like Embodiment 3, it is possible to reduce the size of the first semiconductor chip, and thus it is possible to reduce the size of power amplification device 100d.

Embodiment 6

In Embodiments 1 through 5, for example, as indicated in Embodiment 5, the area of a terminal electrode and the area of a first ground electrode in plan view are different, but this example is non-limiting. In Embodiment 6, in plan view, the area of a terminal electrode is the same as the area of a first ground electrode. Note that in Embodiment 6, elements that are the same as in Embodiments 1 through 6 share the same reference signs, and repeated description thereof is omitted.

Figure 12:
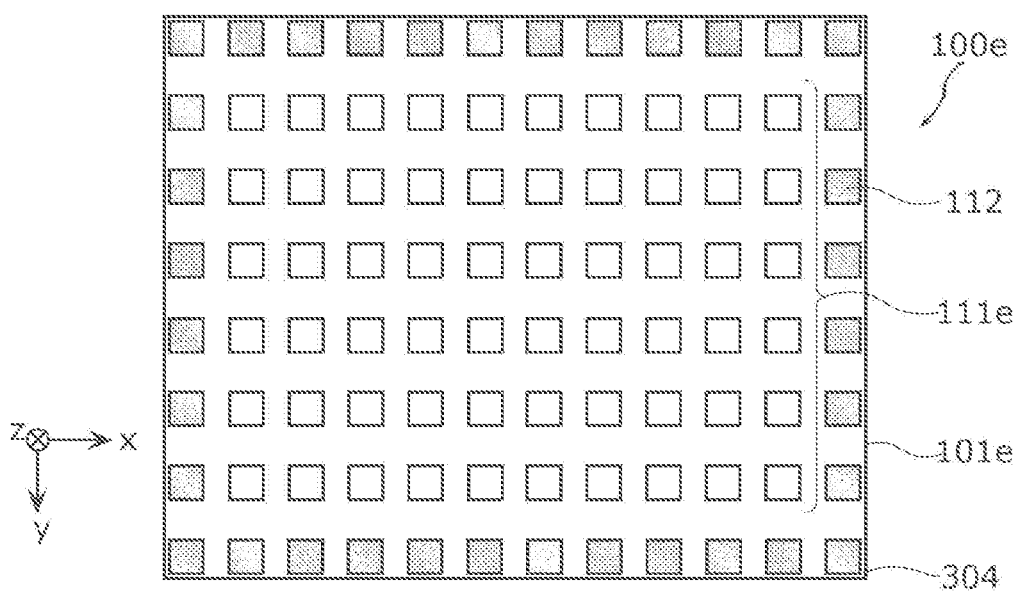
FIG. 12 illustrates a rear view of a power amplification device according to Embodiment 6.

First, the configuration of power amplification device 100e according to Embodiment 6 will be described with reference to FIG. 12. FIG. 12 illustrates a rear view of power amplification device 100e according to Embodiment 6. Note that in FIG. 12, the plurality of terminal electrodes 112 are shaded with dots for visual distinction.

Excluding mainly the two following points, power amplification device 100e according to the present embodiment has the same configuration as power amplification device 100 according to Embodiment 1. The two points are, specifically, that: a plurality of first ground electrodes 111e are provided; and the area of terminal electrode 112 and the area of first ground electrode 111e are the same.

Power amplification device 100e includes the elements included in power amplification device 100 according to Embodiment 1, and a plurality of first ground electrodes 111e provided spaced apart from one another.

Although the arrangement of the plurality of first ground electrodes 111e on fourth main surface 304 is not particularly limited, for example, the plurality of first ground electrodes 111e may be arranged in a matrix in plan view, as illustrated in FIG. 12. The plurality of first ground electrodes 111e need not be arranged in a matrix.

The plan view shape of the plurality of first ground electrodes 111e is, but not limited to, a square shape; the plan view shape of the plurality of first ground electrodes 111e may be a rectangular shape, a polygonal shape, or a circular shape or the like. Moreover, the plurality of first ground electrodes 111e are not all required to have the same shape. In the present embodiment, the area of each and every first ground electrode 111e is the same, but this example is non-limiting.

The total number of first ground electrodes 111e aligned in the long side direction of sub-mount substrate 101e is greater than the total number of first ground electrodes 111e aligned in the short side direction of sub-mount substrate 101e. In the present embodiment, the long side direction of sub-mount substrate 101e is the x-axis direction, and the short side direction of sub-mount substrate 101e is the y-axis direction.

Typically, sub-mount substrate 101e often warps along the long side direction due to stress differences. Accordingly, by providing a plurality of spaces between each of the plurality of first ground electrodes 111e in the long side direction, warping of sub-mount substrate 101e can be reduced. Accordingly, by providing more first ground electrodes 111e aligned in the long side direction than first ground electrodes 111e aligned in the short side direction, warping of sub-mount substrate 101e can be reduced. Note that warping of sub-mount substrate 101e can be reduced by arranging the plurality of first ground electrodes 111e in a matrix in plan view, like in FIG. 12.

Just like in Embodiment 1, the plurality of terminal electrodes 112 are provided on fourth main surface 304 in the present embodiment as well. Each of the plurality of terminal electrodes 112 is electrically connected to a circuit node provided on sub-mount substrate 101e. Each of the plurality of terminal electrodes 112 is disposed in the periphery of fourth main surface 304 so as to surround the plurality of first ground electrodes 111e. The plurality of terminal electrodes 112 are provided spaced apart from one another.

The plan view shape of the plurality of terminal electrodes 112 is, but not limited to, a square shape; the plan view shape of the plurality of terminal electrodes 112 may be a rectangular shape, a polygonal shape, or a circular shape or the like. Moreover, the plurality of terminal electrodes 112 are not all required to have the same shape. In the present embodiment, the area of each and every terminal electrode 112 is the same, but this example is non-limiting.

In the present embodiment, in plan view, the area of each of the plurality of terminal electrodes 112 and the area of each of the plurality of first ground electrodes 111e are the same.

Next, the process of mounting sub-mount substrate 101e to the motherboard will be described. A bonding material (for example, solder or the like) is used in the mounting. As is the case in the present embodiment, when the area of each of the plurality of terminal electrodes 112 and the area of each of the plurality of first ground electrodes 111e are the same, upon melting the bonding material in the reflow process, the height of the bonding material that bonds first ground electrodes 111e and the height of the bonding material that bonds terminal electrodes 112 are the same, making it easy to bond sub-mount substrate 101e to the motherboard. In other words, it is possible to improve the mountability of sub-mount substrate 101e to the motherboard.

Note that in the present embodiment, a plurality of terminal electrodes 112 are provided, but this example is non-limiting; a single terminal electrode 112 may be provided. In this case, the area of the single terminal electrode 112 and the area of each of the plurality of first ground electrodes 111e are the same.

This configuration also achieves the same advantageous effects as when a plurality of terminal electrodes 112 are provided.

Furthermore, in the present embodiment, each of the plurality of terminal electrodes 112 and each of the plurality of first ground electrodes 111e are the same shape (square shape) and are the same area.

This configuration further improves the mountability of sub-mount substrate 101e to the motherboard.

Embodiment 7

In Embodiment 6, the shape of each and every first ground electrode is the same, and the area of each and every first ground electrode is the same, but this example is non-limiting. In Embodiment 7, a plurality of first ground electrodes are provided that have mutually different shapes and mutually different areas. Note that in Embodiment 7, elements that are the same as in Embodiments 1 through 6 share the same reference signs, and repeated description thereof is omitted.

Figure 13:
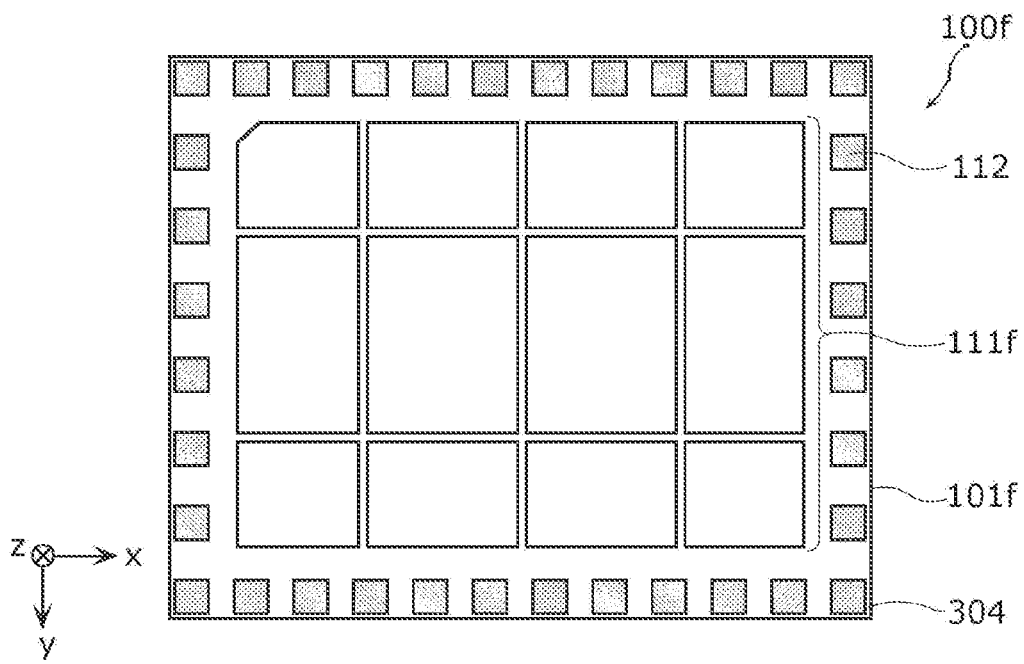
FIG. 13 illustrates a rear view of a power amplification device according to Embodiment 7.

First, the configuration of power amplification device 100f according to Embodiment 6 will be described with reference to FIG. 13. FIG. 13 illustrates a rear view of power amplification device 100f according to Embodiment 7. Note that in FIG. 13, the plurality of terminal electrodes 112. are shaded with dots for visual distinction.

Excluding the provision of a plurality of first ground electrodes 111f having mutually different shapes and mutually different areas, power amplification device 100f according to the present embodiment has mainly the same configuration as power amplification device 100e according to Embodiment 6. Note that some of the plurality of first ground electrodes 111f have the same shape and same area, as illustrated in FIG. 13.

In plan view, the plurality of first ground electrodes 111f are arranged in a matrix, and the total number of first ground electrodes 111f aligned in the long side direction of sub-mount substrate 101f is greater than the total number of first ground electrodes 111f aligned in the short side direction of sub-mount substrate 101f. In this regard, the plurality of first ground electrodes 111f according to the present embodiment are the same as the plurality of first ground electrodes 111e according to Embodiment 6.

By providing more first ground electrodes 111f aligned in the long side direction than first ground electrodes 111f aligned in the short side direction, it is possible to reduce warping of sub-mount substrate 101f, just like in Embodiment 6.

Note that as illustrated in FIG. 13, with the exception of one first ground electrode 111f, the plurality of first ground electrodes 111f have a rectangular shape. The one first ground electrode 111f has a pentagonal shape. This makes it easier to confirm the orientation of power amplification device 100f when viewed from the rear.

Embodiment 8

In Embodiment 4, the long side direction of the plurality of first filled vias and the long side direction of the plurality of second filled vias are parallel, but this example is non-limiting. In Embodiment 8, the long side direction of the plurality of first filled vias and the long side direction of the plurality of second filled vias are not parallel. Note that in Embodiment 8, elements that are the same as in Embodiments 1 through 7 share the same reference signs, and repeated description thereof is omitted.

Figure 14:
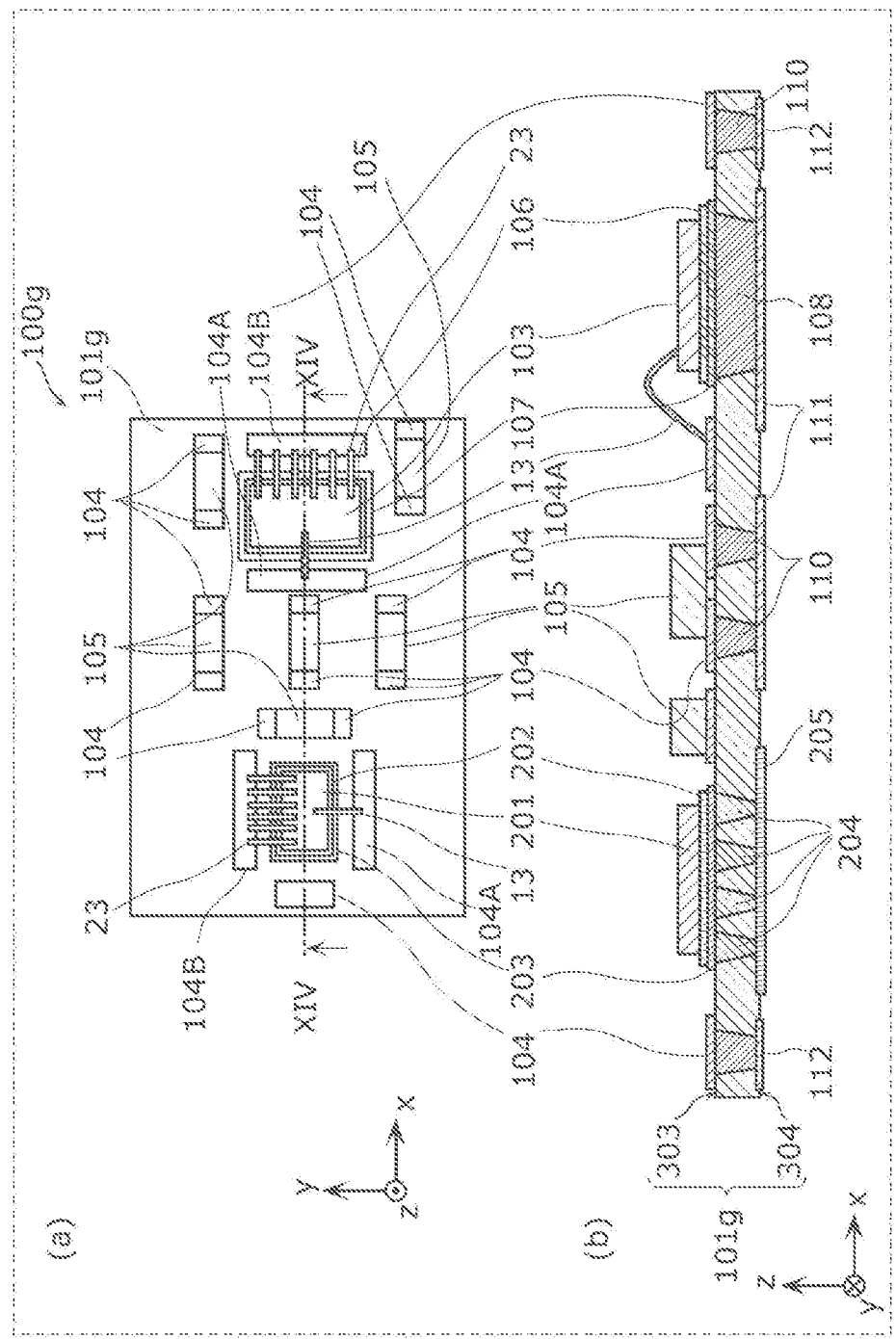
FIG. 14 illustrates a plan view and a cross sectional view of a power amplification device according to Embodiment 8.

First, the configuration of power amplification device 100g according to Embodiment 8 will be described with reference to FIG. 14. FIG. 14 illustrates a plan view and a cross sectional view of power amplification device 100g according to Embodiment 8. More specifically, (a) in FIG. 14 illustrates a plan view of power amplification device 100g, and (b) in FIG. 14 illustrates a cross sectional view of a cross section taken along line XIV-XIV in (a) in FIG. 14.

Power amplification device 100g according to the present embodiment mainly includes the same elements as power amplification device 100c according to Embodiment 4. However, in power amplification device 100g according to the present embodiment, the orientation of elements related to second semiconductor chip 201 relative to sub-mount substrate 101g is different.

Specifically, the elements related to second semiconductor chip 201 are: second semiconductor chip 201; second filled vias 2.04; second ground electrode 205; second bonding material 202; second die pad electrode 203; the second field-effect transistor; the gate electrode, drain electrode, and source electrode included in the electrodes of the second field-effect transistor; gate wire 13; drain wires 23; and wiring patterns 104A and 104B.

Here, all elements related to second semiconductor chip 201 will be regarded as a collective unit. In power amplification device 100g according to the present embodiment, compared to power amplification device 100c according to Embodiment 4, all elements related to second semiconductor chip 201 that are regarded as a single unit are rotated 90° counter-clockwise in plan view.

In other words, in the present embodiment, the long side direction of the plurality of second filled vias 204 is the y-axis direction. Accordingly, in the present embodiment, the long side direction of the plurality of first filled vias 108 and the long side direction of the plurality of second filled vias 204 are not parallel. Specifically, the long side direction of the plurality of first filled vias 108 and the long side direction of the plurality of second filled vias 204 intersect each other at a 90° angle.

Moreover, since the gate electrode included in the electrodes of the second field-effect transistor is rotated 90° counter-clockwise in plan view, the direction of extension of the plurality of second gate finger parts included in the gate electrode is also rotated 90° counter-clockwise in plan view. Accordingly, in the present embodiment, the direction of extension of the plurality of second gate finger parts is the y-axis direction.

Here, in second semiconductor chip 201, the high frequency signal is input into the plurality of second gate finger parts and amplified by and output from the plurality of second drain finger parts.

When the transmission direction of the high frequency signal is referred to as a second transmission direction in this case, the second transmission direction is the direction of extension of the plurality of second gate finger parts (the y-axis direction). Note that the first transmission direction is the x-axis direction, as described in Embodiment 1. In other words, in the present embodiment, the second transmission direction and the first transmission direction are not parallel.

In the present embodiment, the plurality of second drain finger parts included in the drain electrode included in the electrodes of the second field-effect transistor are electrically connected to the plurality of first gate finger parts 11 included in gate electrode 10 included in the electrodes of the first field-effect transistor. Note that, as described in Embodiment 4, the drain electrode may include a single second drain finger part, and in such a case, the single second drain finger part is electrically connected to the plurality of first gate finger parts 11.

In this case, it is possible to achieve the following circuit configuration.

Figure 15:
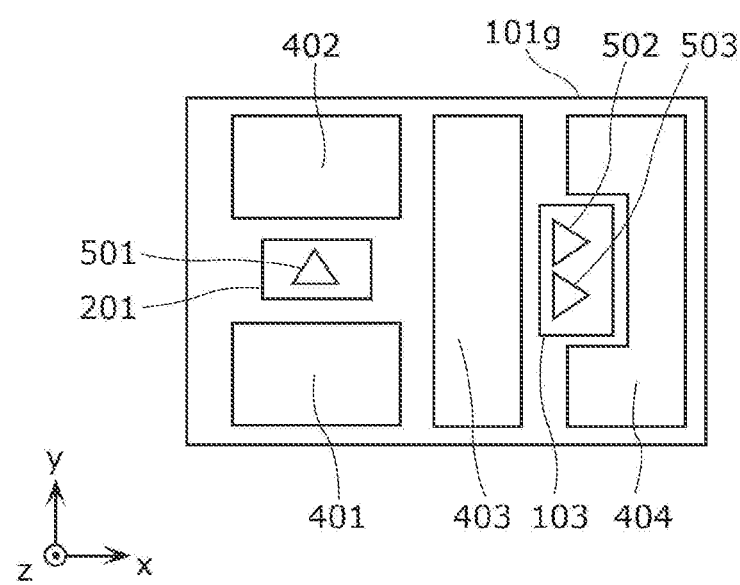
FIG. 15 illustrates an arrangement of circuits in the power amplification device according to Embodiment 8.

As one example, a case in which a multi-stage Doherty amplifier is applied in power amplification device 100g will be described. In this case, it is necessary to include an input matching circuit, an output matching circuit, a power distribution circuit, or a phase adjustment circuit in sub-mount substrate 101g in a manner that is efficient in terms of area. One example of such a configuration is illustrated in FIG. 15. FIG. 15 illustrates an arrangement of circuits in power amplification device 100g according to Embodiment 8.

Second semiconductor chip 201 is driver amplifier 501, and first semiconductor chip 103 is carrier amplifier 502 and peak amplifier 503.

Sub-mount substrate 101g is provided with first area 401, second area 402, third area 403, and fourth area 404. First area 401 corresponds to the input matching circuit of driver amplifier 501. Second area 402 corresponds to the output matching circuit of driver amplifier 501. Third area 403 corresponds to the power distribution circuit and/or the input matching circuit for the Doherty amplifier (carrier amplifier 502 and peak amplifier 503). Fourth area 404 corresponds to the phase adjustment circuit and/or the output matching circuit for the Doherty amplifier.

The high frequency signal output from second semiconductor chip 201 is distributed by the power distribution circuit and input into carrier amplifier 502 and peak amplifier 503 forming the Doherty amplifier formed by first semiconductor chip 103. Furthermore, the high frequency signals output from carrier amplifier 502 and peak amplifier 503 are combined via an output combining circuit and/or the phase adjustment circuit.

As described above, in the present embodiment, the long side direction of the plurality of first filled vias 108 and the long side direction of the plurality of second filled vias 204 are not parallel. With this, first area 401, second semiconductor chip 201, and second area 402 can be aligned in the y-axis direction, and third area 403, first semiconductor chip 103, and fourth area 404 can be aligned in the x-axis direction. This makes it possible to inhibit sub-mount substrate 101g from increasing in size in a single direction such as the x-axis direction. In other words, the area of sub-mount substrate 101g can be efficiently utilized, and power amplification device 100g can be downsized.

Moreover, as described above, in the present embodiment, the second transmission direction and the first transmission direction are not parallel. With this, high frequency signal interference between driver amplifier 501 and carrier amplifier 502 and/or peak amplifier 503 of the Doherty amplifier can be reduced, thereby stabilizing operation of first semiconductor chip 103 and second semiconductor chip 201.

Embodiment 9

Embodiment 9 has the same configuration as Embodiment 1, but a position of a central portion of a heat generating region of the first semiconductor chip coincides with a position of a central portion of the first die pad electrode. Note that in Embodiment 9, elements that are the same as in Embodiment 1 share the same reference signs, and repeated description thereof is omitted.

Figure 16:
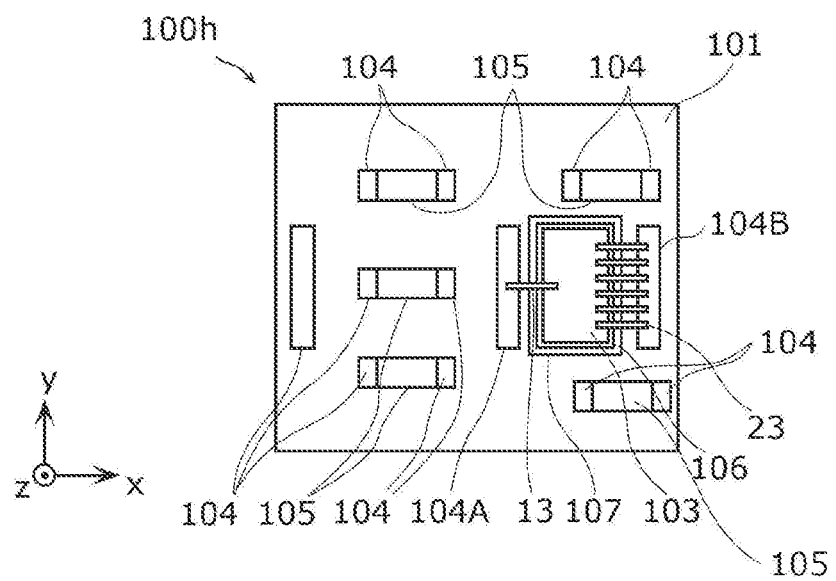
FIG. 16 illustrates a plan view of a power amplification device according to Embodiment 9.
Figure 17:
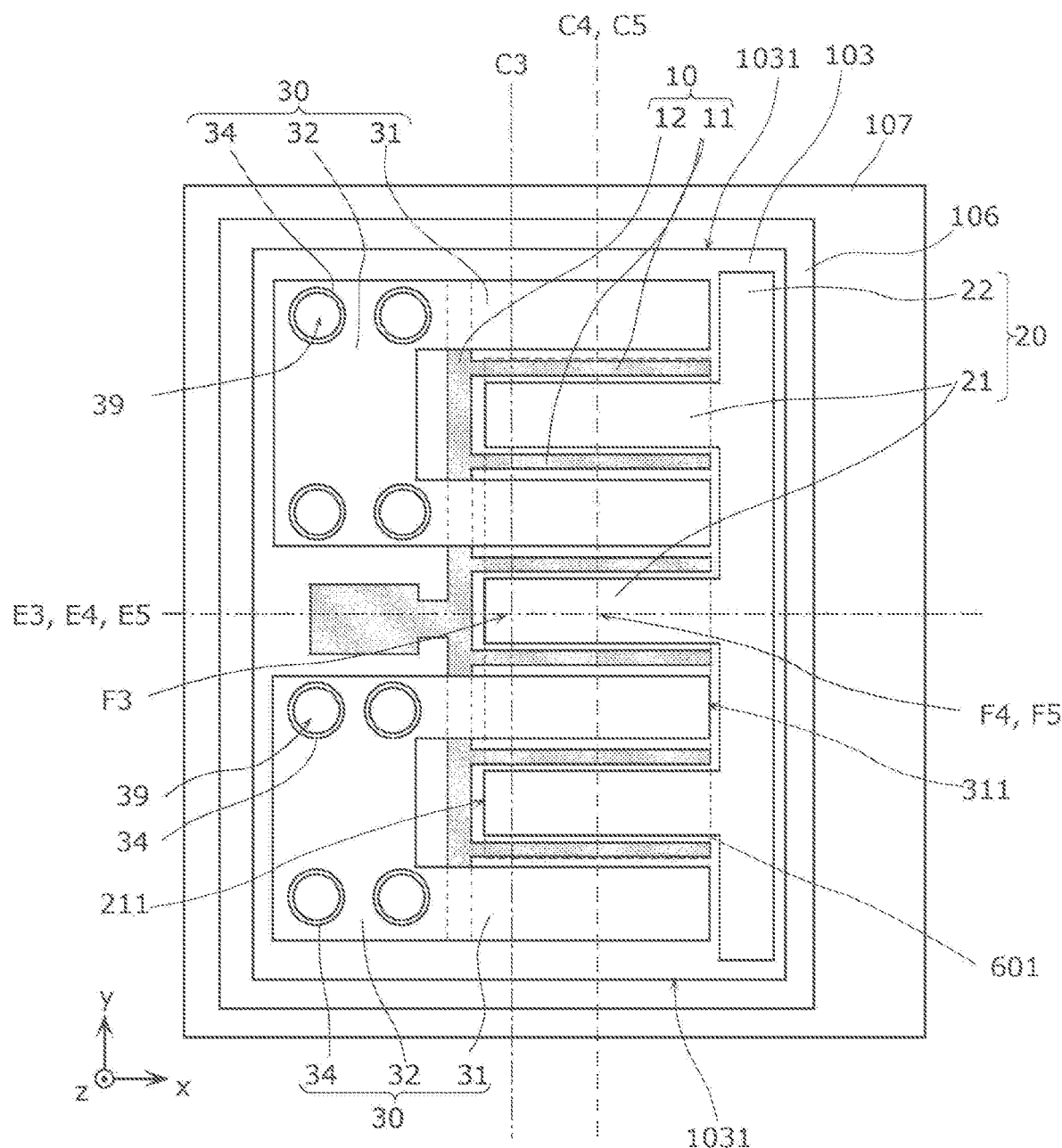
FIG. 17 illustrates an enlarged plan view of the surrounding area of a first semiconductor chip included in the power amplification device according to Embodiment 9.

The configuration of power amplification device 100h according to Embodiment 9 will be described with reference to FIG. 16 and FIG. 17. FIG. 16 illustrates a plan view of power amplification device 100h according to Embodiment 9. FIG. 17 illustrates an enlarged plan view of the surrounding area of first semiconductor chip 103 included in power amplification device 100h according to Embodiment 9.

Excluding the differences in arrangement of first semiconductor chip 103, first bonding material 106, and first die pad electrode 107, power amplification device 100h according to the present embodiment has mainly the same configuration as power amplification device 100 according to Embodiment 1.

Next, heat generating region 601 of first semiconductor chip 103 drawn with a dashed line in FIG. 17 will be described.

Each edge of first semiconductor chip 103 that is parallel to the long side direction of the plurality of first gate finger parts 11 (the x-axis direction) is referred to as edge 1031. Since first semiconductor chip 103 has a rectangular plan view shape, first semiconductor chip 103 includes two edges 1031, as illustrated in FIG. 17.

Moreover, an edge of a distal end of source finger part 31, which is the end not connected to source wiring part 32, is referred to as edge 311, and an edge of a distal end of first drain finger part 21, which is the end not connected to drain wiring part 22, is referred to as edge 211.

In plan view, heat generating region 601 is the region delimited by: one first gate finger part 11 included in the plurality of first: gate finger parts 11 that is closest to one of edges 1031; one first gate finger part 11 included in the plurality of first gate finger parts 11 that is closest to the other of edges 1031; edge 311 of the distal end of source finger part 31; and edge 211 of the distal end of first dram finger part 21. More specifically, heat generating region 601 is the region delimited by one first gate finger part 11 closest to one of edges 1031, one first gate finger part 11 closest to the other of edges 1031, and imaginary lines that are extensions of edge 311 and edge 211 along the y-axis.

Stated differently, heat generating region 601 is a region delimited by: the outermost peripheral first gate finger parts 11 disposed between first drain finger parts 21 and source finger parts 31; source wiring part 32, and drain wiring part 22.

Moreover, as illustrated in FIG. 17, one first gate finger part 11 that is closest to one of edges 1031 and one first gate finger part 11 that is closest to the other of edges 1031 are provided within heat generating region 601.

In the present embodiment, the center line of first semiconductor chip 103 that is perpendicular to the x-axis direction is referred to as center line C3, the center line of first semiconductor chip 103 that is perpendicular to the y-axis direction is referred to as center line E3, and the central portion of first semiconductor chip 103 at the intersection of center line C3 and center line E3 is referred to as central portion F3. Similarly, the center line of first die pad electrode 107 that is perpendicular to the x-axis direction is referred to as center line C4, the center line of first die pad electrode 107 that is perpendicular to the y-axis direction is referred to as center line E4, and the central portion of first die pad electrode 107 at the intersection of center line C4 and center line E4 is referred to as central portion F4. Furthermore, the center line of heat generating region 601 that is perpendicular to the x-axis direction is referred to as center line C5, the center line of heat generating region 601 that is perpendicular to the y-axis direction is referred to as center line E5, and the central portion of heat generating region 601 at the intersection of center line C5 and center line E5 is referred to as central portion F5.

The position of central portion F5 of heat generating region 601 and the position of central portion F3 of first semiconductor chip 103 do not coincide. In first semiconductor chip 103 according to the present embodiment, it is necessary to take the arrangement and the like of source via hole parts 34 into consideration, and furthermore, although not illustrated in the figures, electrostatic discharge (ESD) protection elements and circuits such as a bias circuit and a matching circuits are provided therein. Since such a first semiconductor chip 103 is designed to be a small as possible, there may be cases in which the position of central portion F5 of heat generating region 601 does not coincide with the position of central portion F3 of first semiconductor chip 103.

First die pad electrode 107 is approximately at least 50 μm and at most 150 μm larger than first semiconductor chip 103 on each side, in order to accommodate for first bonding material 106 protruding from first semiconductor chip 103 or variations in mounting positions of first semiconductor chip 103. Since first die pad electrode 107 comprises a metal (for example, Au, Cu, or Ag or the like) having a rate of thermal conductivity of 300 W/mK or higher, the heat from first: semiconductor chip 103 is also diffused in a horizontal direction (xy plane direction) of first die pad electrode 107. Accordingly, it is better to enlarge the area of first die pad electrode 107. In other words, heat can be efficiently dissipated by increasing the area over which heat is dissipated. It is sufficient if first die pad electrode 107 is approximately at least 100 μm and at most 300 μm larger than first semiconductor chip 103 on each side.

Increasing the size of first die pad electrode 107 beyond this increases the length of the bonding wires between the wiring pattern of sub-mount substrate 101 and first, semiconductor chip 103, which reduces performance and further increases the size of sub-mount substrate 101. Note that it is better if the y-axis direction size of first die pad electrode 107 is larger than the x-axis direction size since there are no bonding wires in the y-axis direction.

Moreover, the position of central portion F5 of heat generating region 601 and the position of central portion F4 of first die pad electrode 107 coincide. In other words, when mounting first semiconductor chip 103 to first die pad electrode 107, first semiconductor chip 103 is mounted such that the position of central portion F4 of first die pad electrode 107 and the position of central portion F5 of heat generating region 601 coincide. Stated differently, here, first semiconductor chip 103 is mounted such that the position of central portion F3 of first semiconductor chip 103 is slightly offset from the position of central portion F4 of first die pad electrode 107. This configuration makes it possible to diffuse the heat from first semiconductor chip 103 in a horizontal direction of first die pad electrode 107 so as to spread evenly over the entire first die pad electrode 107. In other words, power amplification device 100h that is capable of even more efficiently dissipating heat from heat sources is realized. As used herein, positions of central portions coinciding means the two positions being compared are positioned 50 μm or less from each other in plan view.

Moreover, in the present embodiment, first semiconductor chip 103 is mounted off-center from first die pad electrode 107. Accordingly, by covering regions other than the mounting region of first die pad electrode 107 (a region delimited by expanding each side of first semiconductor chip 103 by at least 50 μm and at most 150 μm) with solder resist, it is possible to prevent incorrectly positioning components when mounting them and thus improve mounting position accuracy.

Embodiment 10

Like Embodiment 2, Embodiment 10 also uses a multi-layer substrate, but the plan view areas of the inner wiring patterns in the sub-mount substrate are larger than the plan view area of the first die pad electrode. Note that in Embodiment 10, elements that are the same as in Embodiment 2 share the same reference signs, and repeated description thereof is omitted.

Figure 18:
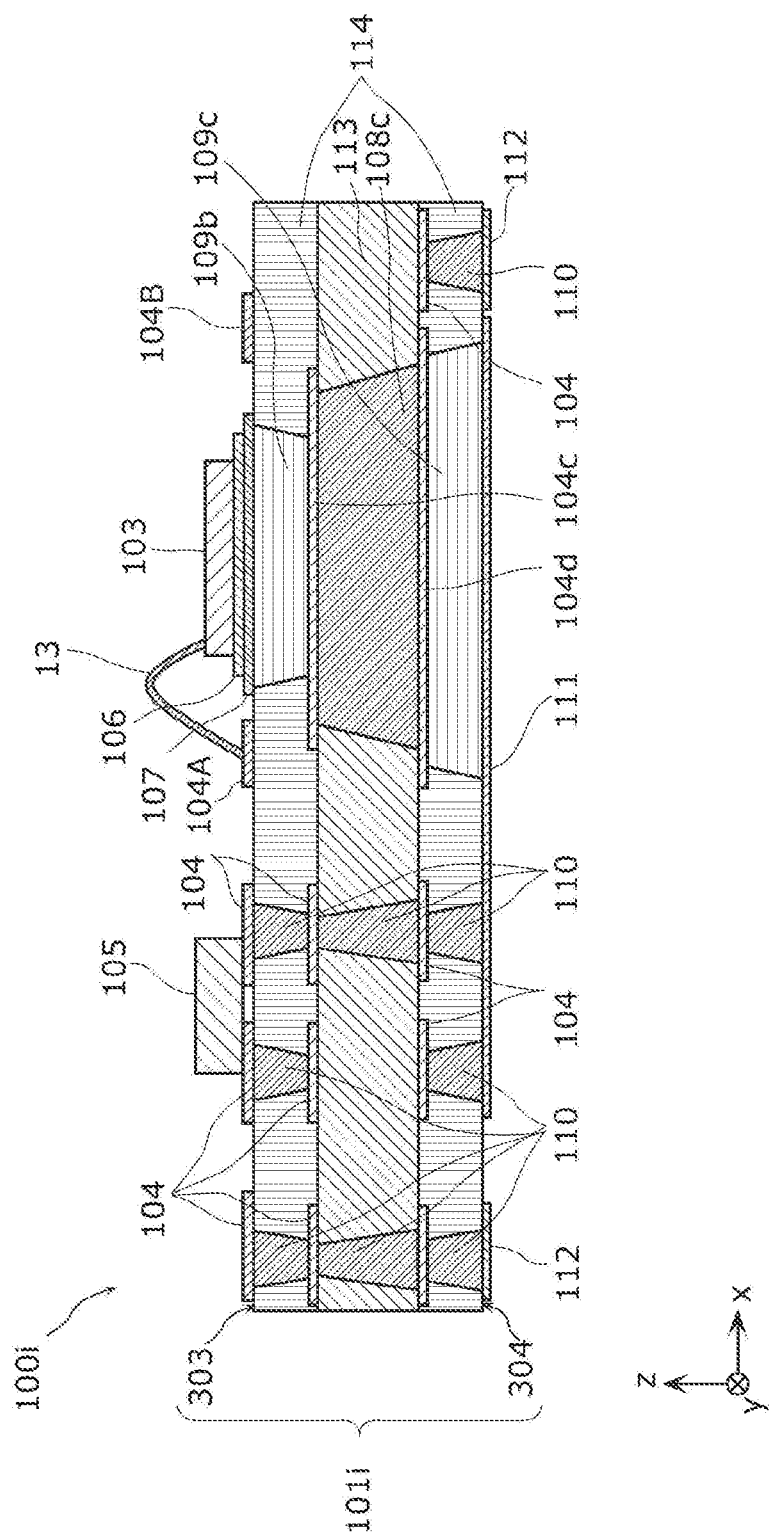
FIG. 18 illustrates a cross sectional view of a power amplification device according to Embodiment 10.
Figure 19:
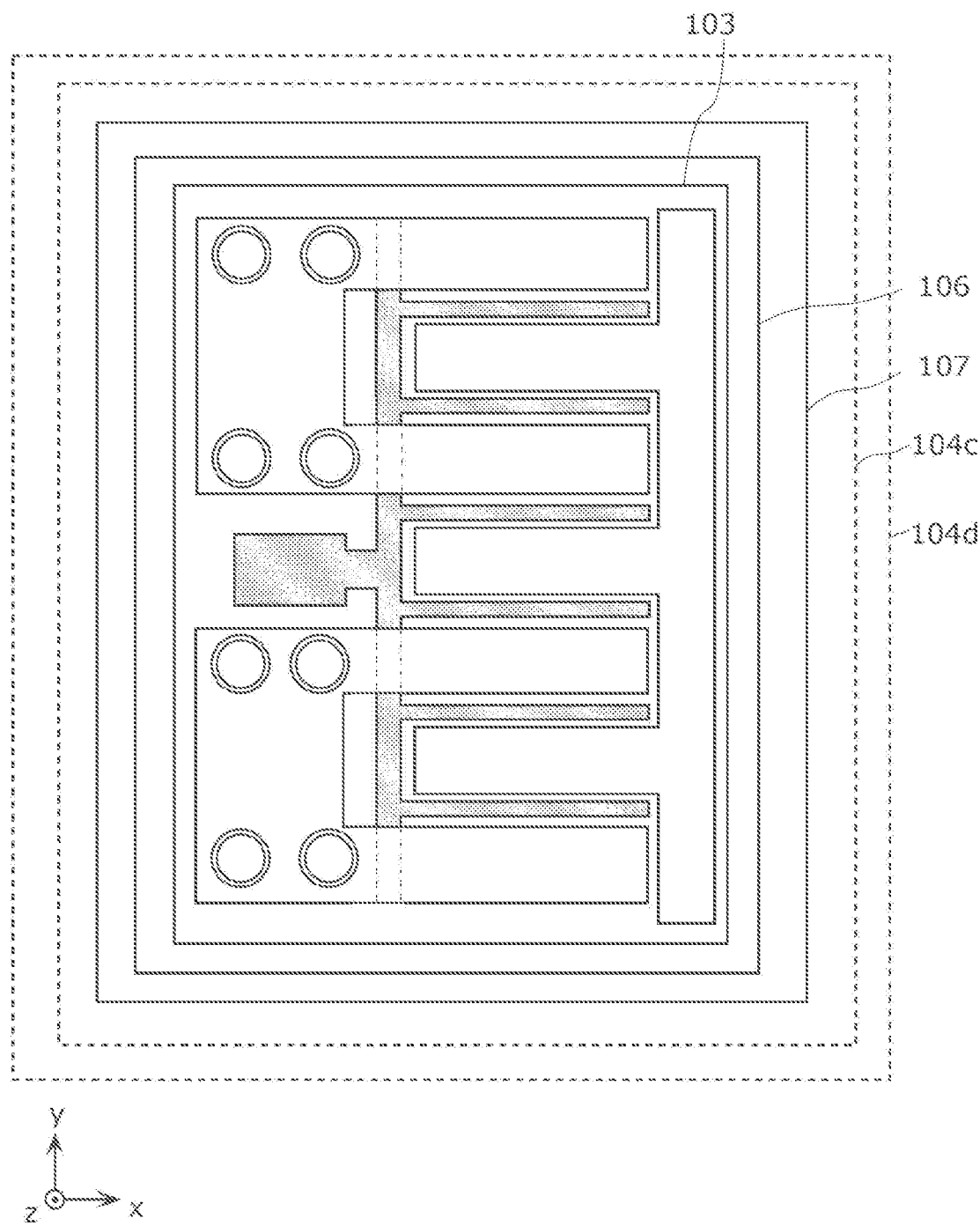
FIG. 19 schematically illustrates an enlarged plan view of the surrounding area of a first semiconductor chip included in the power amplification device according to Embodiment 10.

First, the configuration of power amplification device 100i according to Embodiment 10 will be described with reference to FIG. 18 and FIG. 19. FIG. 18 illustrates a cross sectional view of power amplification device 100i according to Embodiment 10. More specifically, FIG. 18 corresponds to FIG. 8 according to Embodiment 2. FIG. 19 schematically illustrates an enlarged plan view of the surrounding area of first semiconductor chip 103 included in power amplification device 100i according to Embodiment 10.

Excluding the plan view areas of the wiring patterns located below first semiconductor chip 103 sequentially increasing in size with increasing distance from first: semiconductor chip 103, power amplification device 100i according to the present embodiment has the same configuration as power amplification device 100a according to Embodiment 2.

Sub-mount substrate 101i is a multi-layer substrate and includes core layer 113 and two prepreg layers 114.

Here, wiring pattern 104c is provided between core layer 113 and the upper prepreg layer 114, and wiring pattern 104d is provided between core layer 113 and the lower prepreg layer 114. Wiring patterns 104c and 104d are provided below first semiconductor chip 103. Wiring patterns 104c and 104d comprise metal (for example, Au, Cu, or Ag or the like).

Wiring pattern 104c connects third filled via 109b and first filled via 108c. Wiring pattern 104d connects first filled via 108c and third filled via 109c.

In power amplification device 100i according to the present embodiment, as illustrated in FIG. 18 and FIG, 19, the plan view areas of first die pad electrode 107, wiring pattern 104c, wiring pattern 104d, and first ground electrode 111 increase in the listed order.

Moreover, the lengths of third filled via 109b, first filled via 108c, and third filled via 109c in the long side direction (x-axis direction) of first filled via 108c increase in the listed order.

In other words, in sub-mount substrate 101i, the plan view areas of the elements increase from first die pad electrode 107 toward first ground electrode 111. This makes it possible to realize power amplification device 100i that is capable of efficiently dissipating heat from heat sources since the area over which the heat is dissipated is larger.

Other Embodiments

Although the power amplification device according to the present disclosure has been described based on exemplary embodiments, the present disclosure is not limited to these exemplary embodiments. Those skilled in the art will readily appreciate that various modifications may be made in these exemplary embodiments and that other embodiments may be achieved by arbitrarily combining the elements of the embodiments without materially departing from the novel teachings and advantages of the subject matter of the present disclosure. Accordingly, all such modifications and other embodiments are included within the scope of the present disclosure.

For example, a protective film may be provided above first main surface 301 of first semiconductor chip 103. This makes it possible to protect elements provided above first main surface 301. Moreover, in order to protect the bonding wires above the sub-mount substrate according to the embodiments, an overmolding method using resin or the like may be performed, and, alternatively, the bonding wires may be covered with a cap or the like.

Moreover, in the above embodiments, the plurality of first ground electrodes are exemplified as, but not limited to, being provided spaced apart from one another. For example, the plurality of first ground electrodes may be connected to one another. Stated differently, first ground electrodes that occupy a larger plan view area than exemplified in the above embodiments may be provided. In such a case, heat dissipating ability increases since the first ground electrodes occupy a larger area.

Moreover, in the above embodiments, via hole part 39 is exemplified as, but not limited to, a through-hole. For example, via hole part 39 may be filled with a metal (for example, Au, Cu, W, or Ag or the like). Here, via hole part 39 and source via hole part 34 may be integrated as a single via hole part.

Moreover, in Embodiment 9, a plurality of first filled vias may be provided and a multi-layer substrate may be used, like described in Embodiments 1 through 8 and Embodiment 10. In such a case, the advantageous effects indicated in Embodiments 1 through 8 and Embodiment 10 are achieved. For example, when the plurality of first filled vias described in Embodiment 1 are provided, heat from heat sources is conducted to the first ground electrodes by way of the plurality of first filled vias, and easily dissipated from the first ground electrodes. In other words, a power amplification device that is capable of even more efficiently dissipating heat sources is realized. Moreover, various modifications, exchanges, additions and omissions are possible within the scope of the appended claims and the equivalents thereof.

INDUSTRIAL APPLICABILITY

The present disclosure is capable of providing a power amplification device with improved heat dissipating ability.

The invention claimed is:

1. A power amplification device, comprising:
a first semiconductor chip comprising a compound and including a first main surface and a second main surface opposite the first main surface;
a first field-effect transistor provided on the first semiconductor chip;
a first drain finger part, a plurality of first gate finger parts, and a source finger part which are provided above the first main surface and included in electrodes of the first field-effect transistor;
a source pad electrode provided below the second mam surface and electrically connected to the source finger part;
a sub-mount substrate comprising a resin and including a third main surface and a fourth main surface opposite the third main surface;
a first filled via comprising a metal and provided penetrating from the third main surface to the fourth main surface;
a first die pad electrode provided on the third main surface and connected to the first filled via;
a first ground electrode provided on the fourth main surface and connected to the first filled via; and
a bonding material comprising metal and bonding the second main surface and the first die pad electrode,
wherein, in plan view, the first filled via has a rectangular shape,
a long side direction of the first filled via is parallel to a long side direction of the plurality of first gate finger parts, and
in plan view, the first filled via is positioned to overlap part of one first gate finger part included in the plurality of first gate finger parts.

2. The power amplification device according to claim 1, wherein when a widthwise direction is defined as a direction perpendicular to the long side direction of the first filled via in plan view,
a central position of a width of the first filled via defined as a length of the first filled via in the widthwise direction coincides with a central position of a width of the one first gate finger part defined as a length of the one first gate finger part in the widthwise direction.

3. The power amplification device according to claim 1, wherein, in plan view, a long-side length of the first filled via defined as a length of the first filled via In the long side direction is longer than a long-side length of the one first gate finger part: defined as a length of the one first gate finger part in the long side direction, 4. The power amplification device according to claim 3, wherein, in plan view, the long-side length of the first filled via is longer than a length of the first semiconductor chip In the long side direction of the first filled via.

5. The power amplification device according to claim 2, wherein, in plan view, the width of the first filled via is wider than the width of the one first gate finger part.

6. The power amplification device according to claim 1, wherein, in plan view, the first filled via is positioned to overlap part of each of two nearest-neighbor first gate finger parts included in the plurality of first gate finger parts.

7. The power amplification device according to claim 1, wherein, in plan view, among the plurality of first gate finger parts, a pitch between nearest-neighbor first gate finger parts interposed by the first drain finger part is narrower than a pitch between nearest-neighbor first gate finger parts interposed by the source finger part.

8. The power amplification device according to claim 1, wherein the first filled via comprises a plurality of first filled vias, and
in plan view, the plurality of first filled vias are positioned to overlap part of every first gate finger part included In the plurality of first gate finger parts, respectively.

9. The power amplification device according to claim 1, further comprising:
a second semiconductor chip including a fifth main surface and a sixth main surface opposite the fifth main surface;
a second filled via comprising a metal and provided penetrating from the third main surface to the fourth main surface; and
a second ground electrode provided on the fourth main surface and connected to the second filled via,
wherein the second filled via is connected to the sixth main surface, and
the second ground electrode is provided spaced apart from the first ground electrode.

10. The power amplification device according to claim 1, wherein the first filled via comprises a plurality of first filled vias,
the first ground electrode comprises a plurality of first ground electrodes provided spaced apart from one another,
the plurality of first ground electrodes are respectively connected to the plurality of first filled vias, and
in plan view, the plurality of first filled vias are positioned to respectively partially overlap the plurality of first gate finger parts.

11. The power amplification device according to claim 1, wherein the first filled via comprises a plurality of first filled vias,
the first ground electrode comprises a plurality of first ground electrodes provided spaced apart from one another,
the plurality of first ground electrodes are respectively connected to the plurality of first filled vias, when a first gate finger pair is defined as two nearest-neighbor first gate finger parts included in the plurality of first gate finger parts,
in plan view, each of the plurality of first filled vias is positioned to overlap part of each of two first gate finger parts in a corresponding first gate finger pair included in the plurality of first gate finger pairs.

12. The power amplification device according to claim 1, wherein the first ground electrode comprises a plurality of first ground electrodes provided spaced apart from one another.

13. The power amplification device according to claim 12, further comprising:
a terminal electrode provided on the fourth main surface and electrically connected to a circuit node provided on the sub-mount, substrate,
wherein, in plan view, an area of the terminal electrode and an area of each of the plurality of first ground electrodes are a same size.

14. The power amplification device according to claim 12, wherein among the plurality of first ground electrodes, a total number of first ground electrodes aligned in a long side direction of the sub-mount substrate is greater than a total number of first ground electrodes aligned in a short side direction of the sub-mount substrate.

15. A power amplification device, comprising:
a first semiconductor chip comprising a compound and including a first main surface and a second main surface opposite the first main surface;
a first field-effect transistor provided on the first semiconductor chip;
a first drain finger part and a plurality of first gate finger parts which are provided above the first main surface and included in electrodes of the first field effect transistor;
a sub-mount substrate comprising a resin and including a third main surface and a fourth main surface opposite the third main surface;
a first filled via comprising a metal and provided penetrating from the third main surface to the fourth main surface;
a first die pad electrode provided on the third main surface and connected to the first filled via; and
a bonding material comprising metal and bonding the second mam surface and the first die pad electrode,
wherein, in plan view, the first filled via has a rectangular shape, and
a long side direction of the first filled via is parallel to a first transmission direction which is a transmission direction of a high frequency signal input into the plurality of first gate finger parts and amplified by and output from the first drain finger part.

16. The power amplification device according to claim 15, further comprising:
a second semiconductor chip including a fifth main surface and a sixth main surface opposite the fifth main surface;
a second field-effect transistor provided on the second semiconductor chip;
a second drain finger part and a plurality of second gate finger parts which are provided above the fifth main surface and included in electrodes of the second field-effect transistor;
a second filled via comprising a metal and provided penetrating from the third main surface to the fourth main surface; and
a second die pad electrode provided on the third main surface and connected to the second filled via,
wherein, in plan view, the second filled via has a rectangular shape,
the second drain finger part is electrically connected to the plurality of first gate finger parts, and
the long side direction of the first filled via and a long side direction of the second filled via are not parallel.

17. The power amplification device according to claim 15, further comprising:
a second semiconductor chip including a fifth main surface and a sixth main surface opposite the fifth main surface;
a second field-effect transistor provided on the second semiconductor chip;
a second drain finger part and a plurality of second gate finger parts which are provided above the fifth main surface and included in electrodes of the second field-effect transistor;
a second filled via comprising a metal and provided penetrating from the third main surface to the fourth mam surface; and
a second die pad electrode provided on the third main surface and connected to the second filled via,
wherein, in plan view, the second filled via has a rectangular shape,
the second drain finger part is electrically connected to the plurality of first gate finger parts, and
the first transmission direction and a second transmission direction are not parallel, the second transmission direction being a transmission direction of a high frequency signal input into the plurality of second gate finger parts and amplified by and output from the second drain finger part.

18. A power amplification device, comprising:
a first semiconductor chip comprising a compound and including a first main surface and a second main surface opposite the first main surface;
a first field-effect transistor provided on the first semiconductor chip;
a first drain finger part, a plurality of first gate finger parts, and a source finger part which are provided above the first main surface and included in electrodes of the first field-effect transistor;
a drain wiring part provided above the first main surface and electrically connected to the first drain finger part;
a source wiring part provided above the first main surface and electrically connected to the source finger part;
a source pad electrode provided below the second main surface and electrically connected to the source finger part;
a sub-mount substrate comprising a resin and including a third main surface;
a first die pad electrode provided on the third main surface; and
a bonding material comprising metal and bonding the second main surface and the first die pad electrode,
wherein when a heat generating region of the first semiconductor chip is defined as a region delimited by, in plan view: one first gate finger part included in the plurality of first gate finger parts that is closest to one of edges of the first semiconductor chip that are parallel to a long side direction of the plurality of first gate finger parts; one first gate finger part included in the plurality of first gate finger parts that is closest to an other of the edges of the first semiconductor chip that are parallel to the long side direction; an edge of a distal end of the source finger part which is an end not connected to the source wiring part; and an edge of a distal end of the first drain finger part which is an end not connected to the drain wiring part, a position of a central portion of the heat generating region does not coincide with a position of a central portion of the first semiconductor chip, and the position of the central portion of the heat generating region coincides with a position of a central portion of the first die pad electrode.

* * * * *